United States Patent
Grace, Jr.

(10) Patent No.: US 10,415,931 B2
(45) Date of Patent: Sep. 17, 2019

(54) WEARABLE ILLUMINABLE DEVICES AND RELATED METHODS

(71) Applicant: Grace Engineering Corp., Memphis, MI (US)

(72) Inventor: Louis Grace, Jr., North Street, MI (US)

(73) Assignee: Grace Engineering Corp., Memphis, MI (US)

( * ) Notice: Subject to any disclaimer, the term of this patent is extended or adjusted under 35 U.S.C. 154(b) by 0 days.

(21) Appl. No.: 15/893,137

(22) Filed: Feb. 9, 2018

(65) Prior Publication Data

US 2018/0180381 A1  Jun. 28, 2018

Related U.S. Application Data

(63) Continuation-in-part of application No. 15/374,112, filed on Dec. 9, 2016, now Pat. No. 10,094,638,
(Continued)

(51) Int. Cl.
| | |
|---|---|
| *F41G 1/34* | (2006.01) |
| *H01L 35/32* | (2006.01) |
| *H01L 35/30* | (2006.01) |
| *H01L 35/18* | (2006.01) |
| *F41C 23/16* | (2006.01) |
| *F41B 5/14* | (2006.01) |

(Continued)

(52) U.S. Cl.
CPC ............ *F41G 1/345* (2013.01); *F41B 5/1403* (2013.01); *F41C 23/10* (2013.01); *F41C 23/16* (2013.01); *F41G 1/30* (2013.01); *F41G 1/38* (2013.01); *F41G 1/467* (2013.01); *H01L 35/18* (2013.01); *H01L 35/30* (2013.01); *H01L 35/32* (2013.01)

(58) Field of Classification Search
CPC ......... H01L 35/30; H01L 35/32; H01L 35/28; F21L 4/00; F21L 4/027; F21L 4/08; F21L 13/00; F21V 33/0004; F21V 33/0008; F21V 29/54; A42B 1/244; A01K 27/006; A44C 15/0015
See application file for complete search history.

(56) References Cited

U.S. PATENT DOCUMENTS

| | | | |
|---|---|---|---|
| 3,938,875 A | 2/1976 | Ruder | |
| 4,470,263 A * | 9/1984 | Lehovec | A41D 13/0053 62/259.3 |

(Continued)

FOREIGN PATENT DOCUMENTS

FR  3029616 A1  12/2014

*Primary Examiner* — Peggy A Neils
(74) *Attorney, Agent, or Firm* — Warner Norcross + Judd, LLP

(57) ABSTRACT

An illuminable device configured to be worn by a mammal and provide visibility to the mammal includes a thermoelectric module and a light source. The illuminable device is configured to be mounted onto a mammal by an article worn by the mammal such that the thermoelectric module is in thermal contact with the mammal's body. The thermoelectric module generates electricity from a thermal gradient, produced from a mammal's body heat that is transferred to the module. The electricity generated by the thermoelectric module powers the light source to illuminate the article worn by the mammal. Related methods are also provided.

19 Claims, 16 Drawing Sheets

Related U.S. Application Data which is a continuation of application No. 14/644,718, filed on Mar. 11, 2015, now Pat. No. 9,528,796.

(60) Provisional application No. 62/460,132, filed on Feb. 17, 2017, provisional application No. 61/968,069, filed on Mar. 20, 2014, provisional application No. 62/025,092, filed on Jul. 16, 2014.

(51) Int. Cl.
*F41G 1/467* (2006.01)
*F41C 23/10* (2006.01)
*F41G 1/30* (2006.01)
*F41G 1/38* (2006.01)

(56) References Cited

U.S. PATENT DOCUMENTS

| | | | |
|---|---|---|---|
| 5,097,828 A | 3/1992 | Deutsch | |
| 5,149,575 A | 9/1992 | Soifer | |
| 5,483,362 A | 1/1996 | Tai et al. | |
| 5,519,591 A * | 5/1996 | McCrary | A44C 15/0015 362/104 |
| 6,461,752 B1 | 10/2002 | Leung | |
| 6,807,742 B2 | 10/2004 | Schick et al. | |
| 7,509,998 B1 | 3/2009 | Rodney | |
| 7,921,570 B1 | 4/2011 | Pulkrabek et al. | |
| 8,231,240 B1 | 7/2012 | Rubio et al. | |
| 8,443,541 B2 | 5/2013 | Elpedes et al. | |
| 8,464,700 B2 | 6/2013 | Smith et al. | |
| 8,619,238 B2 | 12/2013 | Overstreet | |
| 8,683,641 B2 | 4/2014 | Weinberger et al. | |
| 9,146,077 B2 | 9/2015 | Moore et al. | |
| 9,170,079 B2 | 10/2015 | Moore | |
| 9,176,529 B2 * | 11/2015 | Hata | G06F 1/1626 |
| 9,182,194 B2 | 11/2015 | Moore | |
| 9,188,407 B2 | 11/2015 | Moore et al. | |
| 9,243,865 B1 | 1/2016 | Bruhns | |
| 9,297,614 B2 | 3/2016 | Moore | |
| 9,403,261 B2 | 8/2016 | Weinberger et al. | |
| 9,453,702 B2 | 9/2016 | Bruhns | |
| 9,553,475 B2 * | 1/2017 | Boysen, III | H02J 5/005 |
| 9,723,659 B2 * | 8/2017 | Makosinski | H01L 35/30 |
| 9,755,131 B2 * | 9/2017 | Schneider | H01L 35/30 |
| 9,800,017 B1 | 10/2017 | Raring et al. | |
| 10,021,236 B2 * | 7/2018 | Esenwein | H02J 50/20 |
| 2004/0119975 A1 | 6/2004 | Ostler et al. | |
| 2004/0120146 A1 | 6/2004 | Ostler et al. | |
| 2004/0120151 A1 | 6/2004 | Ostler et al. | |
| 2005/0231965 A1 | 10/2005 | Ostler et al. | |
| 2006/0162225 A1 | 7/2006 | Danielson | |
| 2006/0254638 A1 | 11/2006 | Carmeli et al. | |
| 2007/0197885 A1 | 8/2007 | Mah et al. | |
| 2009/0293855 A1 | 12/2009 | Danielson et al. | |
| 2010/0274162 A1 | 10/2010 | Evans | |
| 2011/0268153 A1 | 11/2011 | He et al. | |
| 2011/0284047 A1 | 11/2011 | Johnson et al. | |
| 2013/0137957 A1 | 5/2013 | Wood et al. | |
| 2013/0161343 A1 | 6/2013 | Ferron et al. | |
| 2014/0049950 A1 * | 2/2014 | Vazquez | F21V 33/0004 362/157 |
| 2014/0163394 A1 | 6/2014 | Katz | |
| 2015/0267998 A1 | 9/2015 | Grace, Jr. et al. | |
| 2016/0128141 A1 | 5/2016 | Makosinski et al. | |
| 2016/0143802 A1 | 5/2016 | Tranfaglia et al. | |
| 2016/0154484 A1 | 6/2016 | Kampf | |
| 2016/0242956 A1 | 8/2016 | Pilby Gomez | |

* cited by examiner

WEARABLE ILLUMINABLE DEVICES AND RELATED METHODS

BACKGROUND OF THE INVENTION

The present invention relates to illuminable devices, and more particularly to illuminable devices that can be worn by a mammal.

Various roadways and other paths or routes are shared by a number of users including motorized vehicles, bicycles, pedestrians and pets. Visibility is an important feature of safely sharing routes or areas with all of the different types of users, especially during times of low ambient light, such as in the evening or inclement weather. Bicyclists, pedestrians, and pets will often wear gear that is reflective and/or illuminated to increase their visibility to drivers of motorized vehicles. For example, pedestrians and bicyclists will often wear vests or jackets that include lights to increase their visibility to other users of the roadway. Many pet owners will also dress their pets in vests or collars that include lights to increase the visibility of the pet as well as the pet's owner. This type of illuminated gear typically includes one or more battery powered light sources, such as light emitting diodes (LEDs).

The issue with gear that includes battery powered light sources is that the battery eventually dies. Replacing batteries can be costly and inconvenient. Because the gear is typically used outdoors in varying weather conditions, the lifetime of the battery can vary and can be unpredictable. When the battery dies, the unexpected loss of power can be dangerous if the user is in a situation in which visibility is important for safety reasons, but a replacement battery is not immediately available. For example, if a pedestrian is out for a walk at night and the batteries in an LED vest the pedestrian is wearing die, the pedestrian will have to complete the journey without illumination. Walking at night without illumination for visibility may make it difficult for other users of a route to see the pedestrian.

SUMMARY OF THE INVENTION

An illuminable device includes a thermoelectric module and a light source in electrical communication with the thermoelectric module. The illuminable device can be configured to be worn by a mammal, such as a human or domesticated animal, by attachment of the thermoelectric module and light source to an article that is worn by the mammal. Illuminating the article worn by the mammal increases the visibility of the mammal in low light and inclement weather. The thermoelectric module can generate electricity from a thermal gradient generated when a wearer supplies thermal energy in the form of body heat to the thermoelectric module. With the illuminable device, a mammal can illuminate an article worn by the mammal, optionally with the mammal's own body heat.

In one embodiment, an illuminable device can be configured to be worn by a mammal. The illuminable device can include a thermoelectric module and a light source in electrical communication with the thermoelectric module. The thermoelectric module can be adapted to power the light source so that the light source emits illumination. An article adapted to be worn by the mammal is also adapted to support the thermoelectric module and the light source adjacent the mammal's body. The thermoelectric module can be configured such that when the article is worn by the mammal, thermal energy from the mammal's body is transferred to the thermoelectric module. The thermoelectric module is configured to generate electricity sufficient to power the light source as a result of thermal energy transformed from the mammal's body.

In another embodiment, the article adapted to be worn by the mammal can include a collar, a vest, a shirt, a jacket, a belt, head gear, a bracelet, an arm band, a leg band, a sock, or an anklet. In another, the device can include a plurality of light sources and a plurality of thermoelectric modules, each light source in electrical communication with at least one thermoelectric module.

In another embodiment, the article can include an interior side disposed adjacent the mammal's body when the article is worn by the mammal and an exterior side, opposite the interior side. A heat sink may be disposed on the exterior side of the article and in thermal communication with the thermoelectric module. Optionally, the heat sink includes a plurality of raised features.

In still another embodiment, the light source can include at least one of a light emitting diode (LED), an organic light emitting diode (OLED), and a laser diode.

In another embodiment, the mammal can be at least one of a human and a domesticated animal.

In another embodiment, the illuminable device can include a power source, the power source in electrical communication with the thermoelectric module, the thermoelectric module providing electricity to the power source, the power source adapted to store energy and transfer the energy to the light source. Optionally, the device can include a switch to selectively transfer energy to the light source.

In yet another embodiment, the light source can be connected to a fiber optic for transmitting light emitted by the light source over at least a portion of the article.

In another embodiment, an illuminable device can be configured to be mounted onto an article worn by a mammal. The device can include a thermoelectric module and a light source in electrical communication with the thermoelectric module. The thermoelectric module can be adapted to power the light source so that the light source emits illumination. A mounting element can be adapted to mount the thermoelectric module and the light source on the article worn by the mammal such that the thermoelectric module is adjacent the mammal's body. The thermoelectric module is configured such that when the thermoelectric module is mounted on the article and the article is worn by the mammal, thermal energy from the mammal's body is transferred to the thermoelectric module. The thermoelectric module can be configured to generate electricity sufficient to power the light source as a result of thermal energy transformed from the mammal's body.

According to another embodiment, the mounting element can include at least one of a channel configured to receive a portion of the article therein, a clip, hook-and-loop tape, a snap, a tie, a clamp, and an adhesive.

In another embodiment, a method of illuminating an article configured to be worn by a mammal is provided. A thermoelectric module can be configured to be supported by the article adjacent a body of the mammal when the article is worn by the mammal. The thermoelectric module can be disposed in a location sufficient to transfer thermal energy from the mammal's body to the thermoelectric module, thereby creating a thermal gradient as a result of the transfer of the thermal energy from the mammal's body. Electricity can be generated with the thermoelectric module due to the thermal gradient. A light source is powered by the electricity generated by the thermoelectric module and the light source illuminates the article. The thermoelectric module is configured to generate electricity sufficient to power the light source as a result of thermal energy transferred from the mammal's body such that the illuminated article provides a visible alert of the presence of the mammal.

In still another embodiment, the method includes providing at least one of a capacitor and a battery. An electrical communication is established between the thermoelectric module and the at least one of a capacitor and a battery. The at least one of a capacitor and a battery is charged with the electricity generated by the thermoelectric module.

In one embodiment, the thermoelectric module can be in the form of at least one of a thermoelectric generator (TEG), a Seebeck device, a thermoelectric cooler (TEC) and a Peltier module. The thermoelectric module can generate electricity based on a thermal gradient existing about the module. For example, a thermal gradient can exist between a warm hand or other appendage of a user, and a cold metal component of a projectile shooting device. Thermoelectric generation of electricity can occur with either variation of thermal gradient, that is, electricity generation can occur when one side or surface of the module is either hotter or colder than its surrounding environment, or other components near it.

In another embodiment, an aiming device can be configured so that a thermoelectric module and any associated circuitry is mounted to a hand grip, stock, handle, fore end or other component of a projectile shooting device. The module can be in electrical communication with the light source. The light source can be placed close enough to a fiber optic element, a red dot generator, a reticle, and/or a hologram generator of the aiming device so that upon illumination of a respective sight element, that sight element assists in aiming the device, for example, in less than desirable ambient light conditions. The thermoelectric module in this configuration can generate electricity for the illumination by heat that is generated by an appendage or other body part of the user physically contacting the module or some other element in thermal communication with the module.

In still another embodiment, the aiming device can include a power source. The power source can be electrically coupled to the thermoelectric module and/or the light source. The electricity from the thermoelectric module powers and/or charges the power source. Optionally, the power source can be a capacitor and/or a battery, such as a rechargeable battery. The power source can provide electricity to the light source so the light source emits illumination. In this manner, the thermoelectric module indirectly powers the light source with electricity it generates that is stored in the power source.

In even another embodiment, the thermoelectric module directly powers the light source with electricity that the thermoelectric module generates. The module can be electrically coupled to the light source, and when the module generates electricity, that electricity can be transferred to the light source.

In yet another embodiment, the projectile shooting device can be an archery bow, such as a compound bow, a recurve, a crossbow, or other device from which arrows or bolts can be shot. Alternatively or additionally, the projectile shooting device can be a firearm, such as a handgun, a rifle, a shotgun or a machine gun. Optionally, the firearm can be in the form of a cannon. The firearm can be single shot, automatic or a semiautomatic. The firearm also can be mounted on a vehicle, watercraft or other mode of transportation.

In still yet another embodiment, the aiming device can include one or more fiber optic elements. The fiber optic elements can be illuminated by the light source, and portions of the fiber optic elements can be disposed within a field of view of a user to serve as a sight element. As an example, an end of a fiber optic element can be included on a sight pin and can generally face the user during use of the aiming device.

In a further embodiment, the aiming device can include one or more reticles. The reticle can be illuminated by the light source, and disposed within a field of view of a user to serve as the sight element.

In still a further embodiment, the aiming device can include one or more red dots. The red dot can be formed via a red dot generator, illuminated by the light source, and disposed within a field of view of a user to serve as the sight element.

In still another embodiment, the aiming device can be a holographic sight system that generates a hologram within a field of view of a user to serve as the sight element. The hologram can be in the form of a reticle or other object, which can be built into and/or recorded in an optional viewing window, and can serve as the sight element.

In yet a further embodiment, the aiming device can include one or more front and/or rear sights. The sights, or portions thereof, can be illuminated by the light source, and disposed within a field of view of a user to serve as the sight element.

In even a further embodiment, the thermoelectric module, optional power source, and light source can be included in head lamps, flash lights and other personal lighting devices, such as those utilized in the pursuit of hunting, fishing, hiking, spelunking or other activities.

In another, further embodiment, the aiming device can include a sight element that is illuminated by ambient light, or that is illuminated by a light source powered by secondary power source, such as a primary battery. The aiming device can include the thermoelectric module as well. The thermoelectric module in this aiming device can serve to power the light source to illuminate the sight element when ambient light is insufficient to illuminate the sight element, or can serve as a back-up source of electricity to power the light source in case of primary battery failure. Optionally, the thermoelectric module can serve as a redundant electricity generator to illuminate the sight element when other illumination fails or is insufficiently powered.

In still another, further embodiment, a method is provided including: mounting a thermoelectric module on a projectile shooting device to create a thermal gradient as a result of the transfer of thermal energy from the user's body; generating electricity with the thermoelectric module due to the thermal gradient; powering a light source with the electricity; illuminating the sight element with the light source, so that the user can view the illuminated sight element within a field of view while the projectile shooting device is in a shooting position.

In yet another, further embodiment a method is provided including: transferring thermal energy from a user's body to a thermoelectric module; generating electricity with the thermoelectric module due to the thermal gradient; powering a light source with the electricity; illuminating the sight element with the light source so that the sight element is readily viewable in the user's field of view; aligning the sight element with a target; and optionally shooting a projectile at the target.

These and other objects, advantages, and features of the invention will be more fully understood and appreciated by reference to the description of the current embodiment and the drawings.

Before the embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components.

DETAILED DESCRIPTION OF THE CURRENT EMBODIMENTS

Figure 1:
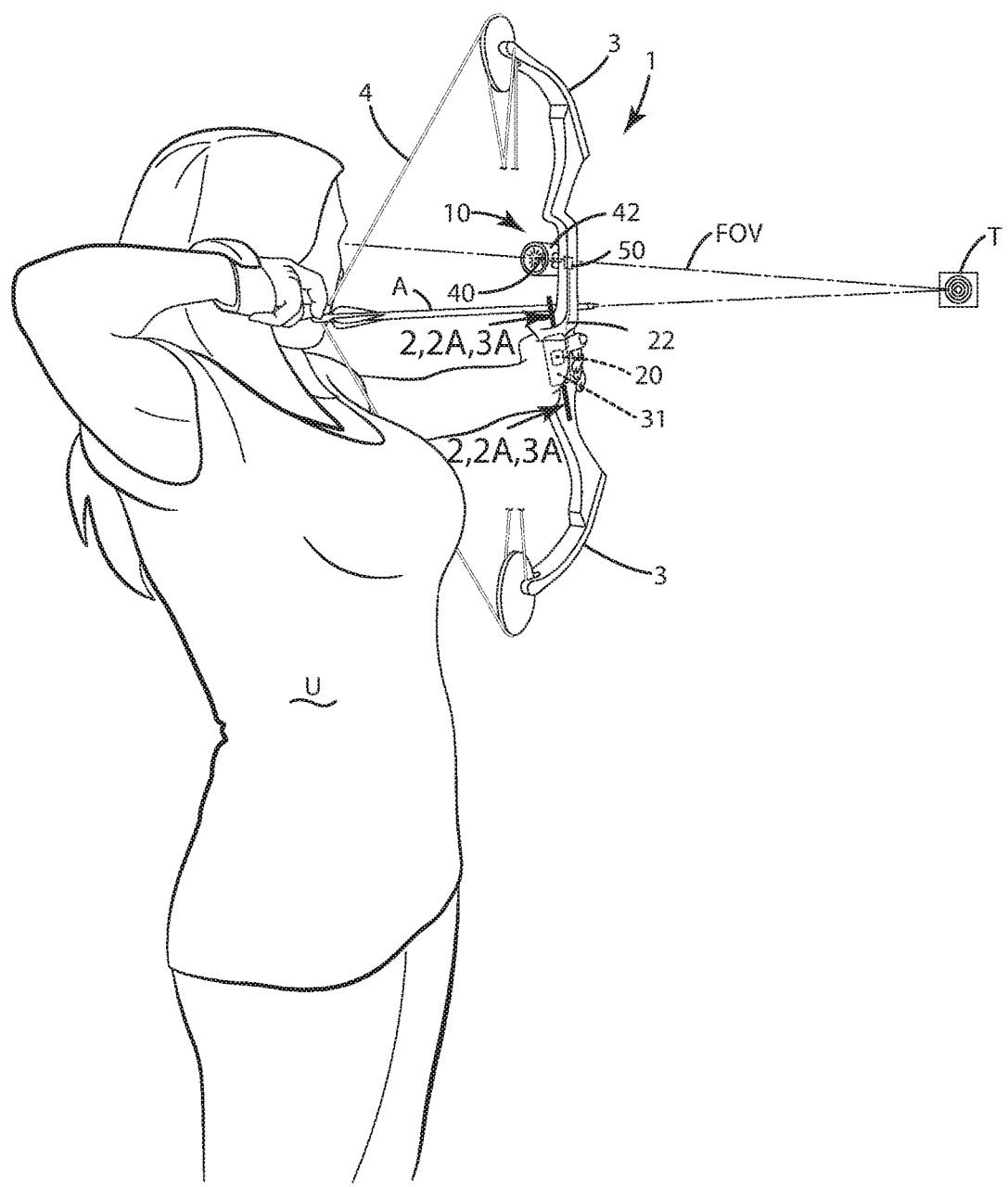
FIG. 1 is a perspective view of an aiming device of a current embodiment joined with a projectile shooting device, namely an archery bow.

An aiming device for use with a projectile shooting device of a current embodiment is shown in FIGS. 1-5 and generally designated 10. The projectile shooting device 1 as illustrated in those figures is generally in the form of an archery bow, for example, a compound archery bow. It will be appreciated, however, that the aiming device of the current embodiments can be used with any type of archery bow, including but not limited to a compound bow, a recurve bow, a crossbow, or other device from which arrows or bolts can be shot. Optionally, the projectile shooting device can be in the form of a firearm, including but not limited to a handgun (for example, a pistol and/or a revolver); a rifle (for example, a long rifle, a carbine, an assault rifle, a bolt pump rifle or a battle rifle); a shotgun (of any gauge) and/or a machine gun (for example, a machine pistol, a light machine gun, a mini gun, a medium machine gun or a heavy machine gun). The firearm can include any type of action, for example, bolt action, lever action, pump action and/or break action. The firearm can be single shot, automatic and/or semiautomatic. Further optionally, the firearm can be in the form of a vehicle-mounted weapon, mounted directly to the vehicle, a watercraft or other mode of transportation of course. As used herein, firearm can also include cannons, howitzers, handheld rocket launchers and similar weaponry, as well as equipment such as paint ball markers and air rifles such as bb guns, air soft guns and/or pellet guns.

As used herein, the term grip area can refer to an area on the projectile shooting device at which thermal energy from a user's body for example, a user's appendage, such as a hand, arm or cheek, can be transferred directly to a portion of the projectile shooting device, and ultimately to the thermoelectric module 20. A grip area can include a hand grip, a stock, a pistol grip, a cheek piece, a receiver or again any location on a firearm or archery bow that might be engaged by a user's appendage or body. A grip area also can include dedicated tabs or projections or areas on an aiming device or a projectile shooting device that do not provide or assist in holding the device in a shooting position. As an example, a bow sight of a bow, or a rifle sight or scope can include a simple projection extending outwardly from a main body. A thermoelectric module can be mounted therein or immediately adjacent that projection. A user can grasp or otherwise warm and transfer thermal energy to that projection, thereby causing the thermoelectric module to generate electricity. A battery or capacitor can store the generated electricity for a predetermined amount of time. Thus, a user need not necessarily transfer thermal energy directly to the thermoelectric module to power the light source during a shooting activity. For example, the user can pre-charge or store power in the power source before the shooting activity. That electricity can be later used when a target is presented.

Returning to the aiming device 10 mounted on an archery bow 1 shown in FIG. 1, the aiming device is generally mounted to a support structure 2. The support structure 2 as illustrated is a riser of the archery bow. In other embodiments, the support structure can be in the form of a stock of a crossbow, or a receiver, a barrel, a mount or other components of a firearm or other projectile shooting device. The aiming device and, in particular, the associated thermoelectric module, can be associated with, joined with or placed adjacent some type of thermally conducting member. As illustrated, this thermally conducting member can be in the form of a grip area, and in particular, a hand grip 31 of the archery bow 1. The hand grip typically is engaged by the user when holding or otherwise manipulating the archery bow.

As illustrated in FIG. 1, the thermoelectric module 20 can be mounted adjacent and/or within a grip area 31. Generally, the grip area 31 and optionally the thermoelectric module 20 can be mounted substantially below the aiming device 10 and more particularly the sight element 40 utilized by the user U when aiming at a target T. The distance by which the hand grip and/or thermoelectric module can be mounted below the aiming device 10, and optionally the sight element 40, can be at least about 1 inch, at least about 2 inches, at least about 3 inches, at least about 4 inches, at least about 5 inches, at least about 6 inches. Of course, other distances can be selected depending on the application. Moreover, with different constructions of an archery bow and/or firearm, the thermoelectric module 20 can be mounted above, beside or in other locations relative to the aiming device 10 and sight element 40.

Figure 2:
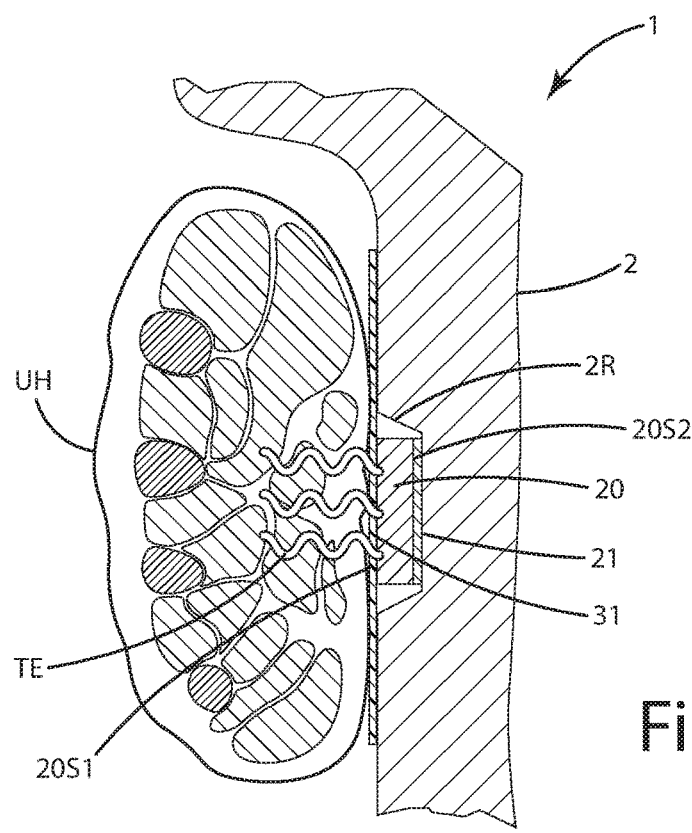
FIG. 2 is a section view of a thermoelectric module mounted to a support structure of the projectile shooting device taken along lines 2, 2A, 2B-2, 2A, 2B of FIG. 1.

The thermally conducting member shown as a grip area, in particular, a hand grip 31 in FIG. 2 can be configured to transfer thermal energy from a user's appendage to the thermoelectric module 20. In this manner, the thermoelectric module can be considered in thermal communication with the thermally conducting member. In the case of a crossbow or firearm, the thermally conducting member can be in the form of a stock, a fore end and/or a pistol grip that is engaged by the user when pointing or shooting the firearm.

Figure 2A:
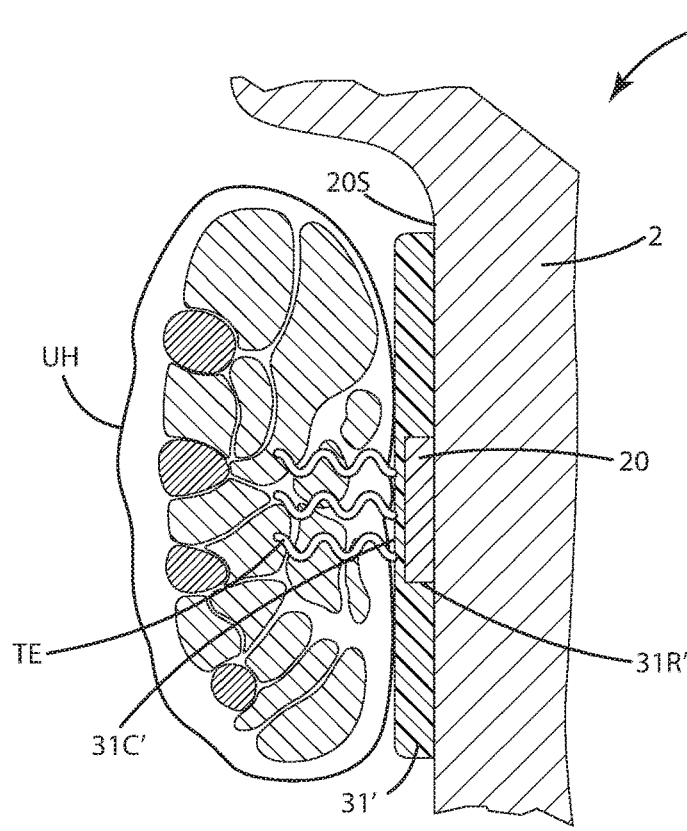
FIG. 2A is a section view of an alternative construction of a thermoelectric module mounted to the support structure taken along lines 2, 2A, 2B-2, 2A, 2B of FIG. 1.

As illustrated in FIGS. 2 and 2A, the thermally conducting member shown as the grip area 31 can be a thin sheet of metal, composite, polymer or other material which enables thermal energy TE from the user's appendage, for example, the user's hand UH, to penetrate therethrough and to transfer to the thermoelectric module 20. In some cases, the thermally conducting member 31 can be integrated directly into the thermoelectric module 20 in the form of a coating, cover or housing joined with the module 20.

Optionally, the thermally conducting member 31' can be in a construction shown in the alternative embodiment of FIG. 2A. There, the thermoelectric module 20 is disposed adjacent an outer surface 2OS of the riser 2. The thermally conducting member 31' can be in the form of a grip area, in particular, a hand grip that is disposed at least partially around the riser 2. The grip can be of a particular thickness sufficient to define a recess 31R'. The thermoelectric module 20 can be disposed within the recess 31R'. When the grip area or thermally conducting member 31' is joined with the riser 2, the thermoelectric module 20, housed within the recess 31R' is placed immediately adjacent, and in some cases contacts, the riser 2 at the outer surface 2OS of the riser 2. The thermoelectric module 20 is held in place within the grip area 31'. Opposite the outer surface 2OS of the riser 2, the thermoelectric module 20 is covered by a thin cover 31C'. This thin cover 31C' and adjacent portions of the thermally conducting member surrounding the recess 31R' can facilitate or enable thermal communication between the user's hand UH so that thermal energy TE can be transferred from the user's hand or appendage to the thermoelectric module 20.

In either embodiment shown in FIGS. 2 and 2A, the thermoelectric module 20 can be disposed within the respective recesses 2R, 31R' using cement, adhesive, fasteners or other elements as desired. Of course, in some constructions, these elements can be eliminated all together with the thermoelectric module 20 being secured within the respective recess via a friction fit and/or simply by virtue of the larger thermally conducting member 31, 31' overlaying the thermoelectric module 20 and capturing it within a respective recess. Optionally, although shown as a recess defined in the riser of an archery bow 1, as will be appreciated, the recess 2R can be defined in any suitable stock or other component of a projectile shooting device, such as a recurve, cross bow or firearm component such as a stock, pistol grip, fore end, and other like components that can be readily grasped and gripped by a user to transfer thermal energy from the user's appendage to the thermoelectric module 20.

With reference to FIGS. 2 and 2A, it will be appreciated that in both embodiments, the user's body heat, for example that thermal energy TE generated by the user's hand UH, is primarily conveyed to a first surface 20S1 of the thermoelectric module 20. The user's appendage, for example, the user's hand UH transfers thermal energy TE to that first surface 20S1. The thermal energy is usually in the form of heat. As with most thermoelectric modules, for them to operate, they are placed adjacent a heat sink or a cooler surface to create a thermal gradient. That cooler surface 20S2 can be on or adjacent the opposite side of the thermoelectric module 20. This surface 20S2 can be cooled or otherwise used to create a thermal gradient by engaging the riser 2 or some other support structure of the projectile shooting device. Typically, the support structure can be constructed from a metal or a composite. Generally, the material from which it is constructed is of a colder temperature than the user's appendage in most ambient conditions. As an example, a user's appendage can be around 98° Fahrenheit. In hunting conditions, where the ambient temperature is about 0° Fahrenheit to 70° Fahrenheit, the support structure, for example, the riser 2 can be cooler than the user's appendage. Of course, in some cases, such as shooting competitions, or when firearms are heated up, the thermal gradient can be reversed. For example, the user's appendage at 98° Fahrenheit or so, can be less than the temperature of support structure, for example, the riser. As a more particular example, where a riser is colored black, and is used in a tournament in 90°, clear weather in full sun, the support structure or riser can heat up to 130°-150°. In this case, the thermal energy from the user, provided through the surface 20S1 to the module 20 can be less than the thermal energy or heat provided through the opposing surface 20S2 from the heat riser. Optionally, the thermoelectric module can be constructed so that even with this reversed thermal gradient, it can generate electricity. In most cases, however, the support structure can be cooler than the user's body, which results in the thermal gradient in which heat from the user's body is channeled toward the support structure, which in turn acts as a heat sink relative to the thermoelectric module 20 to generate electricity voltage and/or current flow. Again, the opposite of this operation is also contemplated herein.

Figures 6, 7:
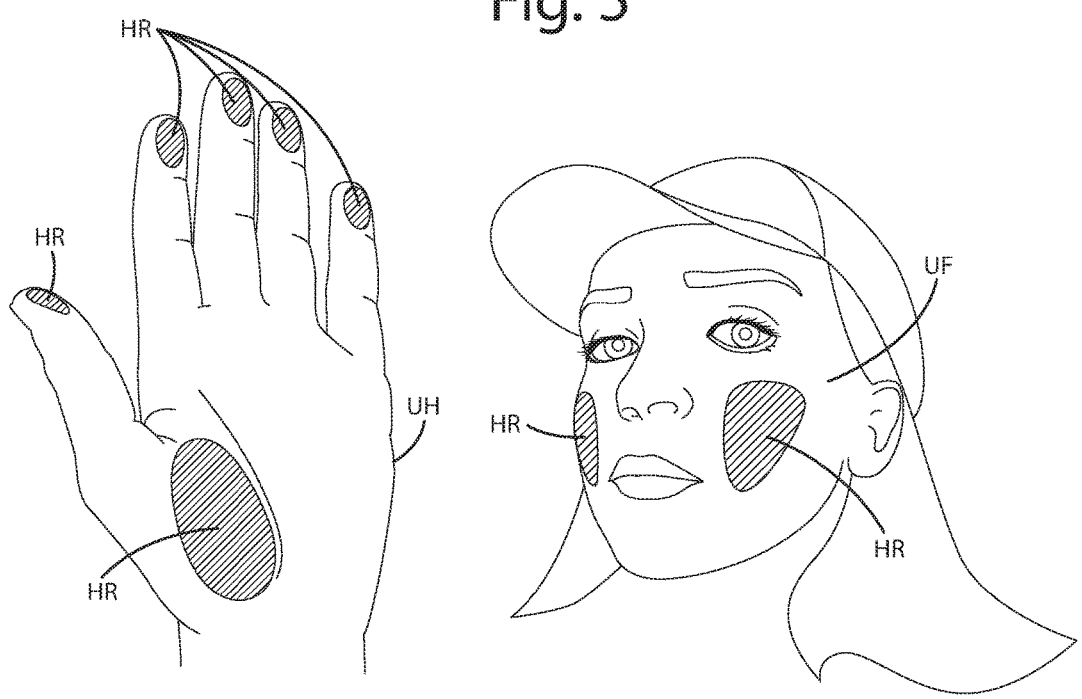
FIG. 6 is a view of a user's appendage, particularly a hand, showing areas of elevated heat generation.
FIG. 7 is a view of another user's appendage, namely a head, showing areas of elevated heat generation.

As mentioned above, a user's body generates the thermal energy that is transferred to the thermoelectric module so that the thermoelectric module can generate electricity to power the aiming device. As shown in FIG. 6, an appendage of the user U, specifically a user's hand UH, is illustrated. There, multiple heat generating regions HR are identified. These regions are generally the warmest or hottest parts of the hand. Accordingly, a particular grip or fore end of a projectile shooting device can be configured so that the thermoelectric module 20 is placed in close proximity to these heat regions HR. Examples of this placement are further illustrated in the description of the embodiments below, where the projectile shooting device is in the form of various firearms. It has also been discovered that the thermal energy generated from a user's face UF, as shown in FIG. 7, can be sufficient to create a thermal gradient to operate the thermoelectric module. As shown there, the user's face UF includes heat regions HR which are generally aligned with the cheeks of the user's face. Thus, a projectile shooting device, when in the form of a crossbow or firearm, can include a stock or other cheek piece in which the thermoelectric module is disposed. This can place a thermoelectric module in close proximity to the facial heat regions HR when a user is shooting and/or aiming the firearm, thereby efficiently transferring thermal energy to a thermoelectric module to ultimately illuminate an associated sight element of the aiming device.

Optionally, the support structure disposed adjacent the opposing surface 20S2 of the thermoelectric module can be constructed from plastic or a composite that is not a suitable heat conductor or heat sink. In such a case, a piece of metal acting as a heat sink can be located adjacent the second surface 20S2 of the thermoelectric module to act as a heat sink. This can be particularly used where the projectile shooting device support structure is constructed from wood or composite—such as a wood or synthetic stock of a firearm or a cross bow. Optionally, other heat sinks used instead of or in addition to metal can be graphite, carbon nanotubes, composites and/or special polymers.

Figure 2B:
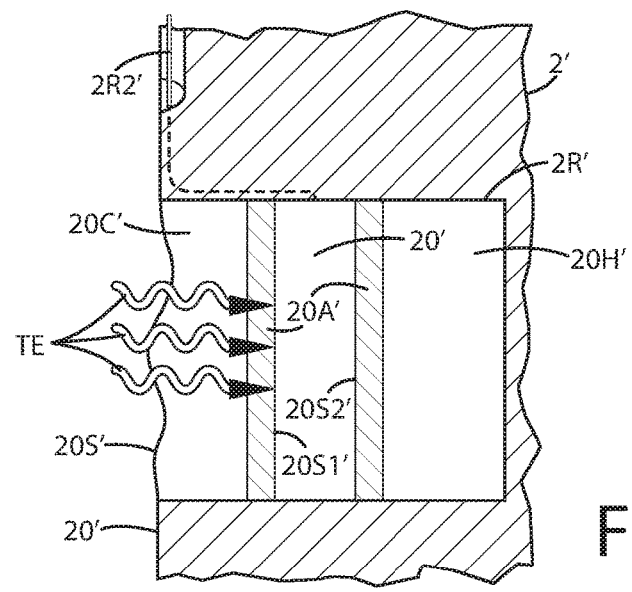
FIG. 2B is a section view of another alternative construction of a thermoelectric module mounted to the support structure taken along lines 2, 2A, 2B-2, 2A, 2B of FIG. 1.

An optional example of such a construction is illustrated in FIG. 2B. There, the thermoelectric module 20' can be embedded in or otherwise disposed in a recess 2R' of a support structure 2'. This support structure 2' can be the riser of a bow, or a stock of a cross bow, or a grip area such as a hand grip, stock, cheek piece or other component of a firearm or cross bow, or generally any other point of contact where a user may engage the support structure. In this construction, the support structure 2' can be a non-thermally conductive material such as wood or composite. In such a construction, the thermoelectric module 20' can be included in the recess 2R' with a secondary heat sink 20H'. The secondary heat sink 20H' can be disposed within the recess 2R' adjacent the second or inner surface 20S2' of the thermoelectric module 20'. If desired, the secondary heat sink 20H' can be adhered within the recess 2R'. Likewise, an adhesive 20A' can be disposed between the secondary heat sink and the thermoelectric module 20' to provide desired positioning and securement of the same. This adhesive 20A' can be thermally conductive so that it does not substantially impair the function of the thermoelectric module 20'.

Opposite the secondary heat sink 20H', adjacent the outer surface 20S1', a thermally conductive member 20C' can be disposed. This thermally conductive member 20C' can generally have less mass than the heat sink so that thermoelectric energy TE from a user's body can be efficiently transferred through the thermally conductive member 20C' to the thermoelectric module 20'. This thermally conducting member 20C' also can be adhered with an adhesive 20A' to the surface 20S1' and generally interfit within the recess 2R'.

The outer surface 20S' of the thermally conducting member 20C' can be contoured to approximate a feature of the user's body, for example, a palm, finger, cheek or the like, that provides the thermal energy TE ultimately to the thermoelectric module 20'. In other embodiments, the outer surface 20S' of the thermally conducting member 20C' can be contoured to approximate and generally match the outer surface 2O' of the support structure 2'. For example, where the support structure 2' is a stock of a firearm, the outer surface 2O' can generally smoothly and seamlessly transition to the outer surface 20S' of the thermally conducting member 20C' so that the thermally conducting member 20C' is not readily identifiable or provides a generally aesthetically pleasing appearance of the outer surface 2O'. Optionally, the thermally conducting member 20C' can be deleted from the construction shown in FIG. 3. The outer surface 20S1' of the thermoelectric module 20' can be generally coextensive and/or contiguous with the outer surface 2O' of the support structure 2'. Optionally, there can be a thin coating of a thermally conductive polymer or other material disposed on the outer surface 20S1' to protect it from the environment in certain applications.

FIG. 2B also illustrates a support structure 2' that defines a secondary recess 2R2' extending generally away from the thermoelectric module 20'. This secondary recess can generally conceal, house and/or protect an electric coupling element 22 extending away from the thermoelectric module 20' toward the light source and optionally other circuitry associated with the light source, as well as other optional electrical components of the aiming device. The secondary recess 2R2' can be in the form of a U- or V-shaped channel. The electrical coupling element 22 can be in the form of a wire, conductive cord, strip, band, tape or other electricity conducting structure. The secondary recess 2R2' can be defined by the outer surface 2O' of the support structure 2'. It can extend over a length of the outer surface 2O' to a location sufficient to establish electrical communication with the light source 50 and/or other circuit components of the aiming device 10. Generally, the thermoelectric module is mounted distal from the light source in most embodiments herein. For this reason, the thermoelectric module 20' is connected to the other elements of the aiming device with the electrical coupling element 20W'. Optionally, the secondary recess 2R2' can be covered with a cap or other type of closure or cover to conceal and/or protect the electrical coupling element 22 disposed therein.

The thermoelectric module 20 can be in the form of a thermoelectric generator (TEG), a Seebeck device, a thermoelectric cooler (TEC) and/or a Peltier module. Generally, the thermoelectric module generates electricity or voltage based on a thermal gradient existing about the module. For example, a thermal gradient can exist between a user's appendage, which generates thermal energy, and a cold metal, composite, polymeric or other heat sink of a projectile shooting device. Generation of electricity via the thermoelectric module can occur with either variation of the thermal gradient. Specifically, electricity generation can occur when one side or surface of the module is either hotter or colder than its surrounding environment or an opposing side or surface of the module as described above. One type of suitable thermoelectric power source is disclosed in U.S. Pat. No. 8,231,240 to Rubio entitled Surface Lighting Devices Having a Thermoelectric Power Source, which is hereby incorporated by reference in its entirety. This type of thermoelectric module, namely a TEG, includes a variety of different thermoelectric materials which can include metallic conductors such as, for example, bismuth and antimony. Other thermoelectric materials can include but are not limited to semiconductors, N-doped semiconductors, and P-doped semiconductors. Some suitable non-metallic thermoelectric materials can include, for example, bismuth chalcogenides, skuderite-type materials and complex oxide materials.

Figure 3:
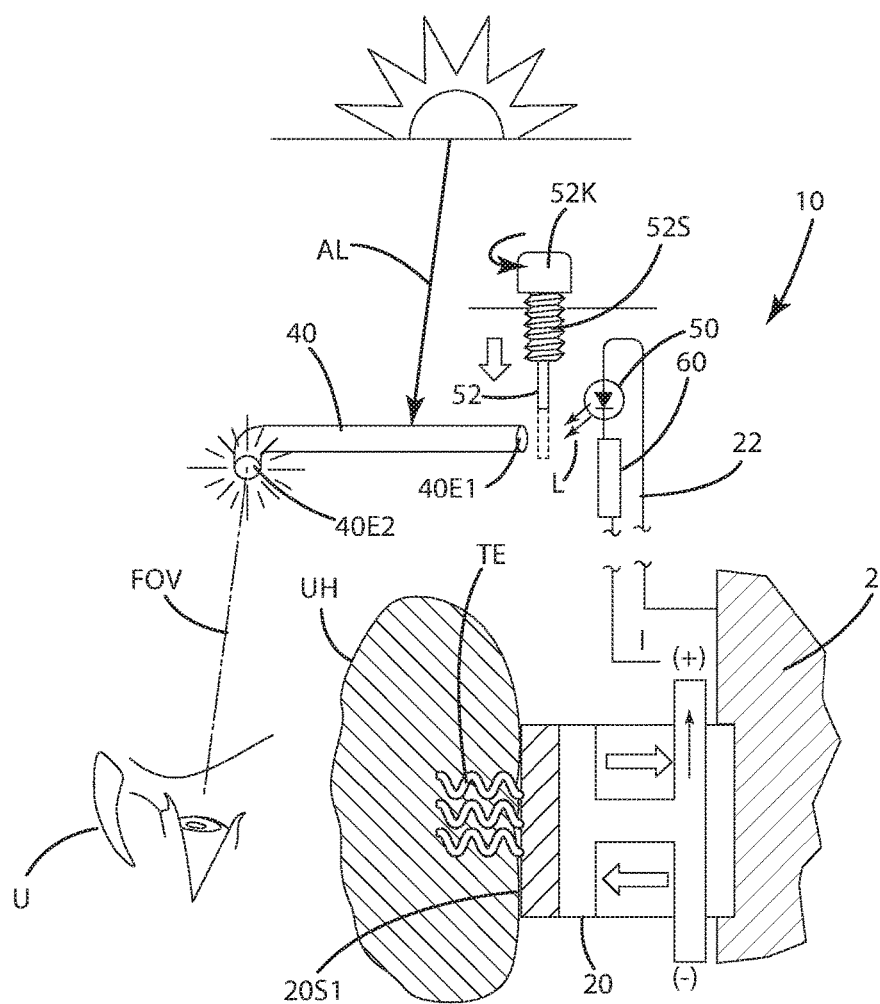
FIG. 3 is a schematic illustrating the various components of the aiming device of the current embodiment.

Generally the thermoelectric module 20 as shown in FIG. 3 operates as follows: a heat source, such as the user's hand UH, transmits thermal energy to the outer surface 20S1 of the thermoelectric module 20. A heat sink 2, for example, a metallic riser of a bow, causes a flow of heat or thermal energy TE from the user's hand toward the heat sink. As heat flows from the heat source, that is, the user's hand UH, toward the heat sink, that is, the riser 2, the charge carriers (e.g. electrons and/or holes) move in the direction of heat flow. Movement of the charge carriers results in an electric current I which moves through the electrical coupling element 22 which is described in further detail below. Ultimately, the electrical current I, also referred to as voltage and/or electricity herein, powers a light source 50. The light source 50 of the aiming device 10 can be a variety of different light sources.

As an example, light emitting diodes (LEDs), organic light emitting diodes (OLEDs), and/or laser diodes can be utilized as the light sources herein. Of course, the light sources can be provided in a variety of colors spanning the visible region of the electromagnetic spectrum. The light sources as utilized in the aiming devices can be continuously lit at a constant intensity when electricity is flowing thereto. Of course, depending on associated circuitry, the light source can be dimmed in response to varying light conditions rather than being turned off entirely. In some cases, the light sources can be configured to blink in a given pattern depending on the particular application.

As further shown in FIG. 1, the thermoelectric module 20 is in electrical communication with the light source 50 and/or other circuitry 60 of the aiming device 10 via an electrical coupling element 22. This electrical coupling element extends from the thermoelectric module toward the light source. As described further below, the electrical coupling element 22 can be on an outer surface of the support structure or mounted within a recess or channel defined by the outer surface of a support structure. Alternatively, the support structure might be hollow so that the electrical coupling element 22 extends through an internal cavity of the support structure.

As mentioned above, the light source 50 shown in FIGS. 1 and 3 can be in the form of an LED or other low voltage draw lighting element. If desired, the electrical requirements of the light source 50 can be selectively matched to the operation of the thermoelectric module 20. In some cases, as described further below, a voltage booster circuit can be utilized to assist in consistently providing electricity at a desired level to the light source 50, for example, when the light source is a laser diode. Generally, the light source 50 emits illumination L. The light source is placed in proximity to any one of a variety of sight elements 40. As explained in connection with the current embodiments, these sight elements can be fiber optic elements, red dot elements, reticles, holographic reticles/images or other indicia or sight items that a user U can align with a target T.

As further shown in FIGS. 1 and 3, at least in the context of an archery bow, the sight element 40 can be in the form of a fiber optic element. A fiber optic element can be constructed from a polymer and specially fabricated to reflect light conveyed through the sight element 40 from a first end 40E1 to a second end 40E2. The first end 40E1 can be disposed adjacent the light element 50 so that light L emitted by the light source 50 is projected at least partially if not substantially upon the end 40E1. The light then travels through the fiber optic element 40 to the end 40E2. As illustrated in FIG. 3, this end 40E2 appears illuminated. Thus, a user U can readily discern the illuminated end 40E2 within the user's field of view FOV. This can be helpful, particularly when ambient light conditions are of low light, for example, at dusk and dawn. With the illuminated end 40E2, the user's ability to appropriately align the sight element with game or a target can be enhanced.

Generally, this sight element, in the form of the fiber optic element, and more particularly, its end 40E2, is disposed within the field of view FOV of the user U to serve as a sight element and align the projective shooting device with the target T. The end 40E2 can generally face the user during use of the aiming device, particularly when illuminated by a light source 50.

The sight element 40 in FIG. 3, in the form of a fiber optic element, can be disposed in or otherwise held or constrained by a sight pin, optionally constructed from metal composites or polymers, to protect the fiber optic element from the environment and to keep it satisfactorily aligned with a user's field of view. The sight pin can be mounted to a housing 42 as illustrated in FIG. 1. The housing itself can be part of an archery sight configured to be attached to the archery bow 1 with fasteners, brackets and/or other constructions.

Figure 4:
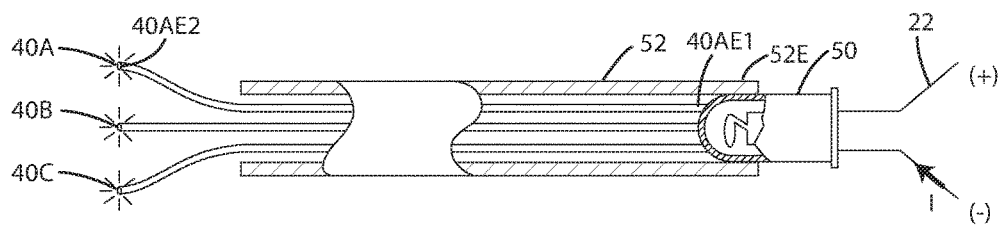
FIG. 4 is a partial section view of a light source and sight elements of the aiming device.

Depending on the application, a single sight element 40 can be illuminated by the light source 50 as shown in FIG. 3. If desired, however, multiple sight elements, optionally in the form of fiber optic elements, can be illuminated by the light source. This is illustrated in FIG. 4. There, the light source 50 is in the form of an LED. The LED is connected via an electrical coupling element 22 to circuitry and/or a thermoelectric module which provides electricity thereby causing the light source 50 to emit illumination. The light source 50 can be joined with a housing 52, which as illustrated, is in the form of a tube. This tube can optionally be constructed from a polymer, such as a heat shrinkable polymer or other polymer. The end 52E of the tube 52 can be disposed over at least a portion of the LED 50. Where the tube is heat shrinkable, this end 52E can be heated to secure the housing 52 to the light source 50. Within the housing or tube 52, multiple fiber optic elements 40A, 40B and 40C can be disposed. The first ends of these fiber optic elements, for example, 40A1 can be disposed immediately adjacent the outer rounded and/or spherical surface optional of the light source 50, particularly where the light source 50 is an LED. The fiber optic element 40A can extend through the housing or tube 52, and can be associated with a sight pin or other sight support so that the second end 40AE2 is readily visible to a user and within the user's field of view.

Figure 5:
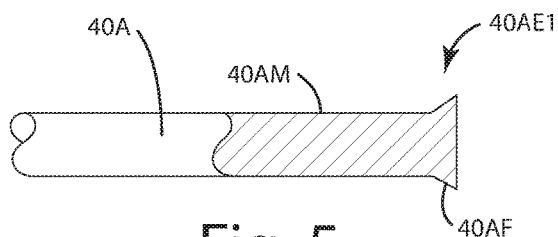
FIG. 5 is a close up partial section view of a sight element of the aiming device of the current embodiment.

Optionally, the ends of the fiber optic elements 40A, 40B, 40C can be specially bonded to the outer surface of the light source 50, for example, with an optically transmissive adhesive or other material. Further optionally, the ends of the fiber optic elements 40A-40C can be disposed adjacent the light source 50 and flared at the ends adjacent the light source 50. For example, as illustrated in FIG. 5, the end 40AE1 includes a flare 40AF. This flare can be joined with a main body portion 40AM of the fiber optic element 40A. The main body element 40AM can have a substantially uniform diameter and circumference. The main body 40AM can transition to the flare 40AF. At the flare, the diameter and the circumference around the exterior surface of the flare 40AF increases as it becomes more distal from the main body 40AM. Put another way, at the end 40AE1 of the fiber optic element 40A, the main body 40AM tapers from a smaller diameter or dimension to a larger diameter or dimension in the flare region 40AF, toward the large end of the element at the right of FIG. 5. The amount of flare and/or tapering can be selected depending on the light transmissive properties of the fiber optic element and/or the method of attachment to, or placement near, the light source 50. Generally, the flare can be configured to enhance light capture by the end of the fiber optic element so that more light is transferred to an opposite end of the element. The flare can also provide a physical structure so that the end near the flare can be physically constrained or captured by another element, such as an aperture, to precisely place the end.

The system and light source 50 herein can serve as a backup to illuminate a sight element when ambient light is insufficient, or when a light source is powered by a secondary power source, such as a battery, which can no longer power the light source due to failure of a battery. For example, as shown in FIG. 3, the fiber optic element 40, in the form of a sight element, can be illuminated by ambient light AL. This, in turn, illuminates the end 40E2 of the sight element 40 to enable a user to view it better within the user's U field of view FOV. When the ambient light decreases, for example, at dusk and dawn, it may be unable to sufficiently illuminate the end 40E2. In this case, the thermoelectric module light source and any associated circuitry can be powered on or actuated to supplement or replace the ambient light with the light L produced by the light source 50. Optionally, thermoelectric module can include an on/off switch described below to selectively turn on or off the light source 50 depending on the user's preferences, or a timer to automatically turn on/off the light source during expected times of low ambient light.

Further optionally, the light source 50 can be joined with a circuit 60 within which another power source is disposed. This power source can be in the form of a replaceable and/or rechargeable battery. When the replaceable/rechargeable battery fails, the circuitry can sense the failure and utilize electricity from the thermoelectric module 20 to alternatively power the light source 50. Thus, the thermoelectric module can operate as a backup source of electricity for the light source. Put another way, the thermoelectric module can serve as a redundant electricity generator to illuminate a sight element when there is insufficient power or electricity provided the light source.

As mentioned above, the light source 50 can output illumination L to illuminate the end 40E2 of the element 40. Optionally, the performance characteristics of the light source can be selectively regulated by a user using a selector that is manually operable by the user. For example, light intensity and/or other light characteristics generated by the light source 50 can be modulated in a variety of manners, for example, via a rheostat that regulates current by varying resistance, a potentiometer voltage divider and/or on/off switch, all of which are described further below.

In the embodiment shown in FIG. 3, the amount of light L reaching the sight element 40 also can be physically modulated using another type of selector. As illustrated, the aiming device 10 can include a shutter 52. The shutter 52 can be selectively moveable from the configuration in solid lines to the configuration shown in broken lines by a user. The shutter, when in the position shown in full lines, generally does not impair the amount of light L that reaches the end 40E1 of the sight element 40. Thus, a significant amount of the light L reaches the end 40E1 to illuminate the sight element 40. The shutter 52 can be coupled to a screw element 52S disposed in a housing (not shown). The screw element 52S can be joined with a knob 52K. The knob 52K can be manually adjustable by a user to effectively move the shutter 52 from the position shown in full lines to the position shown in broken lines. This can be affected by rotating the knob 52K in the direction of the arrow. This translates to linear movement of the shutter 52 downward, so that it is disposed between the light source 50 and the end 40E1. Thus, the amount of light L reaching the end 40E2 is diminished. In this manner, a user can selectively adjust the illumination output at the end 40E2 which again can be used to directly align the sight element with a target. In this construction, the light from the light source 50 can be modulated by simply shading the sight element in varying degrees relative to light emitted from the light source 50.

Figure 8:
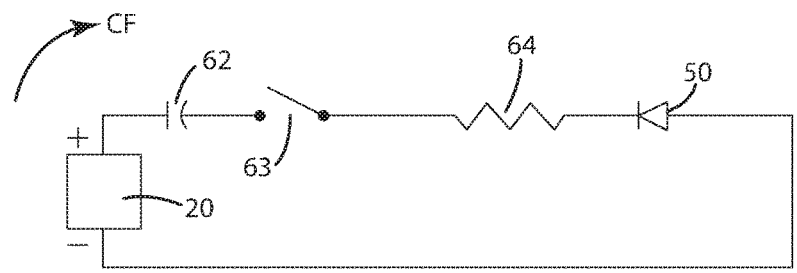
FIG. 8 is a diagram of a circuit for use with the aiming device.

The aiming device can include a circuit 60. This circuit can take on a variety of forms depending on the particular application and desired functionality of the aiming device. One example of a simple circuit that can be used with the aiming device is illustrated in FIG. 8. There, the circuit 60 includes the thermoelectric module 20, which for example, can be a Peltier module that generates current. The current flows in direction of the arrow CF to a capacitor 62. The electricity generated by the thermoelectric module 20 is stored in the capacitor 62. The circuit 60 also can include a switch 63. Closing the switch 63 allows the current to flow, in the direction of the arrow CF. The circuit also can include a resistor 64 and a light source 50. When the switch is closed, electricity flows through the resistor 64 to the light source 50, which optionally can be an LED. This causes the LED 50 to illuminate.

Although shown as including a capacitor 62, the circuit 60 can include a rechargeable battery, such as nickel cadmium or lithium rechargeable battery. Whatever the case, the capacitor or rechargeable battery can serve as a power source to store the electricity and provide current flow or electricity to the light source 50, even when thermal energy TE is not being transmitted directed to the thermoelectric module 20. Where a battery, rechargeable battery and/or capacitor is provided in the circuit 60 to provide electricity or voltage to the light source 50, the thermoelectric module 20 is considered to indirectly power the light source because, technically, the electricity is flowing from the battery or capacitor. Where no battery or capacitor is included, the thermoelectric module is considered to directly power the light source, with the electricity flowing from that module to the light source.

Figure 9:
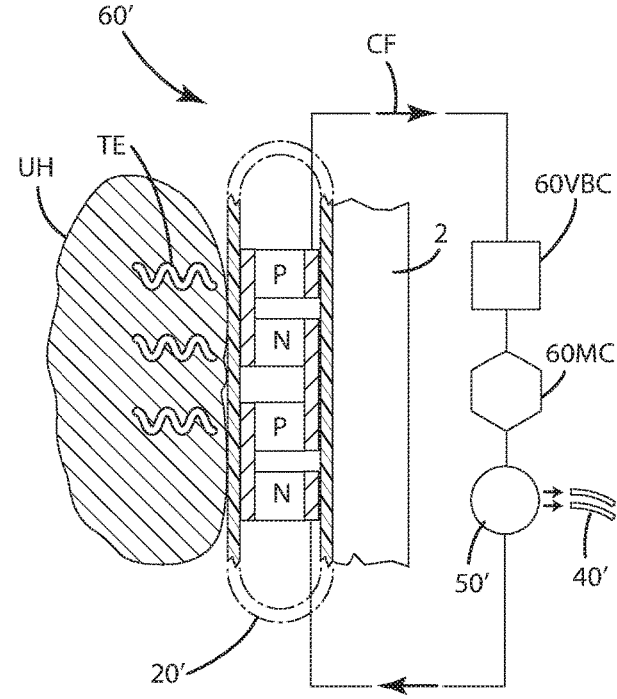
FIG. 9 is a diagram of an alternative circuit for use with the aiming device.

Another example of a circuit is illustrated in FIG. 9. There, the circuit 60' can be coupled to the thermoelectric module 20'. Current flows in the direction CF to a voltage booster circuit 60VBC. There, the voltage can be increased in a variety of manners to provide more voltage ultimately to the light source. Optionally, this can be useful where the light source is a laser diode or LCD. The booster circuit can include a DC/DC converter. It also can be unipolar, with voltages at fixed polarity only, or bipolar with voltage at either polarity. The circuit 60' also can include a light intensity modulation circuit 60MC. This light intensity modulation circuit can include a variety of different electrical components to modulate the current flow to the light source 50' and ultimately to the light L that is transmitted to the sight elements 40'. For example, the light intensity modulation circuit can include a rheostat that regulates the current flow by varying resistance. As another option, the light intensity modulation circuit can include a potentiometer voltage divider. As yet another example, this circuit 60MC can include a simple on/off switch. Other electrical components for modulating light intensity can be included in the modulation circuit 60MC.

Figure 10:
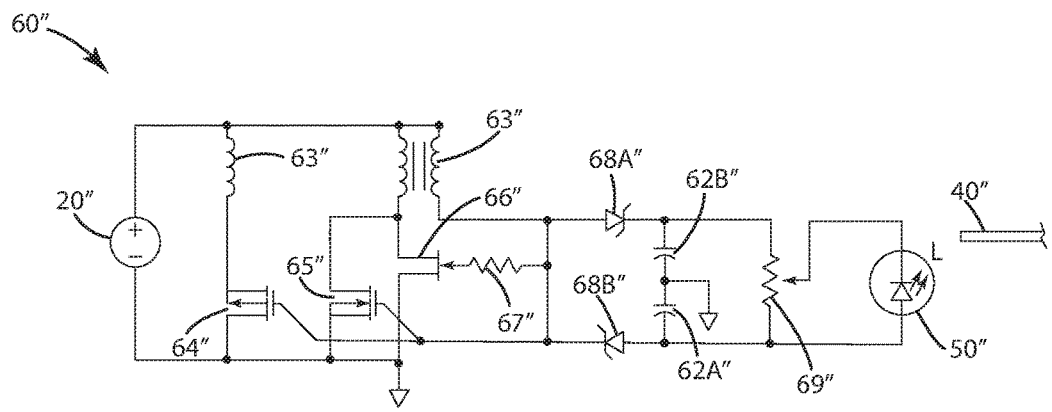
FIG. 10 is a diagram of another alternative circuit for use with the aiming device.

Yet another example of the circuit is shown in FIG. 10. There, the circuit 60" includes a thermoelectric module 20". The circuit also includes a transformer 63" which can include a transformer itself and a second primary side of a transformer. The circuit also can include a P channel enhanced MOSFET 64" and an N channel enhanced MOSFET 65". Downstream, a depletion N channel JFET 66" is included in the circuit. A gate resistor 67" is in electrical communication with the depletion N channel JFET. Diodes 68A" and 68B" are also disposed in the circuit. Capacitors 62A" and 62B" are included to store the power generated by the thermoelectric module 20". A ground can be included in this sub-circuit. The circuit 60" also can include a potentiometer 69" which can be used to modulate the intensity of light emitted from the light source 50. As illustrated, the light source 50 included in the circuit 50" can emit light L to the sight element 40". As explained above, the various components of the circuits described herein can be modified to provide different functionality and/or to accommodate different light sources or power sources as well as different thermoelectric modules.

Figure 8A:
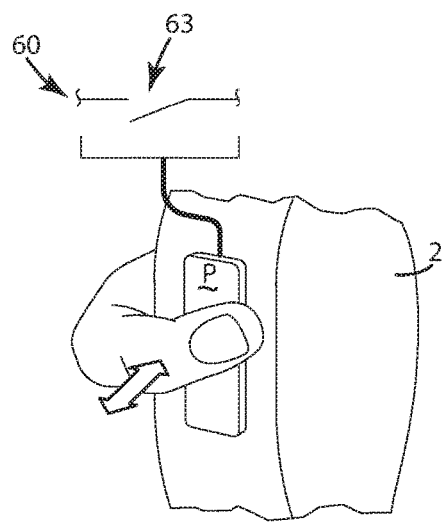
FIG. 8A is a view of a switch included in the circuit for use with the aiming device.

As mentioned above, the circuit 60, or any other circuit described herein, can include an on/off switch 63. The switch 63 can be in the form of various switches, for example, toggle switches, push button switches, pressure switches and the like. As shown in FIG. 8A, the switch 63 can be in the form of a pressure switch P that is mounted to a support structure 2 of the archery bow or projectile shooting device. The pressure switch can be a conventional pressure switch actuated by a user depressing the pressure switch P to close and/or open the switch 63 within the circuit 60. This type of on/off switch 63 can be utilized in conjunction with capacitors and/or a battery. As an example, the thermoelectric module 20 can be used to generate electricity and/or voltage. That voltage and/or electricity can be stored in the capacitor 62 or a battery, as shown in FIG. 8. The user can effectively "charge" the capacitor while waiting for a target. For example, while sitting on stand, a bow hunter can grip the hand grip, transfer the user's thermal energy to the thermoelectric module, which is then stored in the capacitor 62. When game or a target comes within the field of view of the user at a later time, the electricity stored in the capacitor and/or battery can be utilized by switching the switch 63 to the on position, such as by depressing the pressure switch P as shown in FIG. 8A. This in turn causes the light source 50 to illuminate at that time, thereby illuminating or generating light for use by the sight element. Optionally, an additional switching circuit that can stop the flow of electricity or voltage through the circuit thereby turn the light source 50 off until needed, can be provided if the capacitor 62 cannot store sufficient power.

Operation of the aiming device 10 in conjunction with the projectile shooting device in the form of the archery bow 1 shown in FIGS. 1-5 will now be described in further detail. In general, the thermoelectric module 20 is mounted in a location relative to the support structure 2 of the archery bow 1 sufficient to transfer thermal energy from a user's body U. As an example, the thermoelectric module 20 is placed in the grip area, in particular a hand grip 31 of the archery bow. When a user engages the grip area, thermal energy is transferred from the user's appendage to the thermoelectric module 20. A thermal gradient also is created between the user's appendage and/or generally the user's body heat and the colder support structure 20, for example, a riser. This thermal gradient generates electricity, current and/or voltage within the thermoelectric module.

The electricity, current and/or voltage, hereinafter referred to as electricity, is transferred via an electrical coupling element 22 to the circuit 60 shown in FIG. 8. There, the electricity flows in the direction of arrow CF to a capacitor 62, or optionally a battery, rechargeable or otherwise. The capacitor can store electricity until the switch 63 is altered from the off position to the on position. This altering can be performed via a user depressing pressure switch P as shown in FIG. 8A to close the switch 63, thereby allowing the current to flow to the remainder of the circuit 60, ultimately to the light source 50.

Upon the light source illuminating, it transfers light L as shown in FIG. 1 to an end 40E1 of the sight element 40, thereby transferring light to the end 40E2. In the embodiments shown, the illuminating end 40E2 of the sight element 40 is disposed directly in the field of view FOV. A user can align the sight element 40 with a target T as shown in FIG. 1. Upon satisfactory alignment, the user U can release the bowstring 4 of the archery bow 1 thereby propelling the arrow A toward the target. Optionally, the user can selectively choose to illuminate or not illuminate the sight element, depending on the ambient lighting conditions or other factors. Again, this can be accomplished via actuation of the switch in the circuit 60 shown in FIGS. 8 and 8A.

Optionally, when the thermoelectric module generates the electricity, the electricity is communicated to the capacitor 62. The capacitor is charged with electricity generated by the thermoelectric module. The electricity can be stored in the capacitor 62 until the user actuates the pressure switch P, turning the switch 63 in the circuit to the on position to transmit electricity to the light source 50.

Where other circuits are utilized, such as those shown in FIG. 9 or 10, the electricity and voltage provided to the light source can be modulated and/or boosted with the respective voltage boosters and/or light intensity modulators described above.

A method of shooting the archery bow 1 or generally the projectile shooting device, such as a firearm, in general is also provided. In the method, the user takes up the archery bow and transfers thermal energy from the user's body U to the thermoelectric module 20. Electricity is generated with the thermoelectric module 20 due to thermal gradient produced via the thermal energy in the user's body. More particularly, the thermal gradient is produced between the user's body and the support structure 2 of the archery bow 1. The support structure 2 acts as a heat sink for the thermal energy generated by the user's body which again operates as a heat source. In turn, this causes the thermoelectric module 20 to generate electricity.

The electricity is communicated through any of the circuits described herein ultimately to power the light source. With the light source illuminated, it in turn illuminates and/or generates light for use by a portion of the sight element so that the sight element is readily viewable in a user's field of view FOV. As noted herein, a sight element can be in the form of a fiber optic element, a reticle, a red dot element, a holographic image and/or holographic reticle, and/or other elements that assist a user in firing and aiming the projectile shooting device, for example, an archery bow 1. The user aligns the sight element with a target T and subsequently shoots an arrow A at the target. Assuming the sight element 40 is accurately aligned with the target T; the arrow will hit or impact the target T. Of course, where the projectile shooting device is a firearm, instead of shooting an arrow, the device can fire a bullet at the target.

In cases where a capacitor or battery is included in the circuit, the electricity generated by the thermoelectric module can be transferred and stored in that power source. The electricity stored in the power source can be transferred to the light source from the power source during a powering step. Alternatively, with the capacitor, battery or other power sources absent from the circuit, the thermoelectric module can directly power the light source.

In some cases, as mentioned above, the thermoelectric module and light source can serve as a backup or supplement to illuminate the sight element. For example, ambient light can be used primarily to illuminate the sight element, for example, a fiber optic element. When ambient light is sufficient to illuminate the sight element, that ambient light can be used solely by itself. Where ambient light is insufficient for adequate illumination, for example, at dusk or dawn, the thermoelectric module and light source can operate to provide the desired illumination to the sight element. Of course, if ambient light becomes sufficient to illuminate the sight element during a particular activity, the user can discontinue illuminating the sight element with the light source and thermoelectric module and return to illuminate the sight element with ambient light or some other source.

As mentioned above, the user's body generates thermal energy that is transferred to the thermoelectric module so that the thermoelectric module can generate electricity to power the aiming device. As shown in FIG. 6, an appendage of the user, specifically the user's hand UH is illustrated. There, multiple heat generating regions HR are identified. These regions are generally the warmest or hottest parts of the hand. Accordingly, a particular grip area of a projectile shooting device can be configured so that the thermoelectric module is placed in close proximity to the heat regions HR. Examples of such placement are further illustrated with the description of the firearms in the embodiments below, where the projectile shooting devices are in the form of firearms. It also has been discovered that the thermal energy generated from a user's face UF as shown in FIG. 7 can be significant enough to create a sufficient thermal gradient and operate the thermoelectric module. As shown there, the user's face includes heat regions HR which are generally aligned with the cheeks of the user's face. Thus, a projectile shooting device, when in the form of a firearm, can include a stock or other cheek piece in which the thermoelectric module is disposed. This can place a thermoelectric module in close proximity to those heat regions HR when a user is shooting and/or aiming the firearm.

Although described in connection with an archery bow being a projectile shooting device, the aiming device of the current embodiments can be made and used in a similar manner in connection with firearms.

Figure 11:
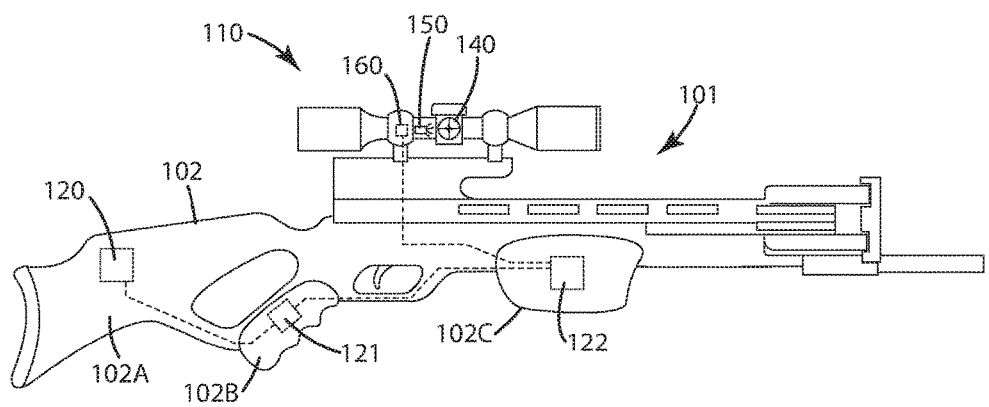
FIG. 11 is a side view of a projectile shooting device, namely a crossbow, including a first alternative embodiment of the aiming device.

A first alternative embodiment of an aiming device associated with projectile shooting device, namely a crossbow, is illustrated in FIG. 11 and generally designated 110. This embodiment is similar in structure, function and operation to the other embodiments described herein with a few exceptions. For example, the aiming device 110 is in the form of a rifle or crossbow scope mounted on crossbow 101. The scope can include an internal sight element 140 which can be in the form of a reticle. The scope can also house a light source 150 and a respective circuit 160, similar to the light source and circuits described above, except housed or otherwise associated with the scope directly. As shown in FIG. 11, there can be one or more thermoelectric modules 120, 121 and 122 arranged in different locations on the support structure, for example, the stock 102 of the crossbow. The stock 102 generally includes a butt stock 102A, a hand grip area 102B and a fore end 102C. A first module 120 can be located in the butt stock 102, generally where the cheek of a user might engage the stock. In turn, this module can absorb thermal energy from a heat region HR of the user's face UF as shown in FIG. 7.

Another additional thermoelectric module 121 can be disposed in the hand grip 102B. This thermoelectric module 121 can absorb thermal energy from one of the user's hands. Yet another thermoelectric module 122 can be disposed in the fore end 102C of the stock 102. This thermoelectric module 122 can absorb heat from another hand of the user when supporting the crossbow in the shooting position 101. As illustrated, the thermoelectric modules 120, 121 and 122 can be daisy chained together in series. These thermoelectric modules thereby each create electricity that is transferred to the circuit 160 and utilized to power the light source, thereby illuminating the reticle 140 for the user as described in further detail below. With the modules daisy chained together in series, the voltage is increased. Optionally, the circuit 160 includes a single voltage booster circuit, if desired, to boost the voltage and adequately power the light source 150.

Although shown with multiple thermoelectric modules 120, 121 and 122, this aiming device 110 included on the crossbow 101 can be modified to include only one or two thermoelectric modules, or more than three modules, depending on the desired function of the light source and illumination of the sight element 140.

Figure 12:
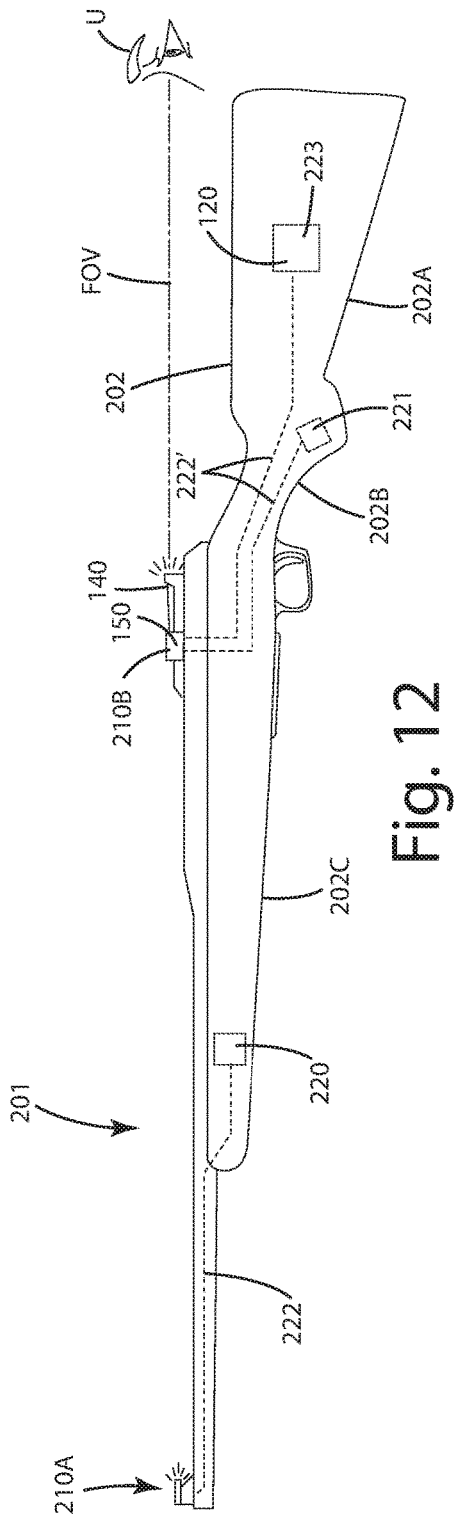
FIG. 12 is a side view of a projectile shooting device, namely a firearm, including a second alternative embodiment of the aiming device.

A second alternative embodiment of the aiming device associated with a projectile shooting device, namely a firearm, is illustrated in FIG. 12 and generally designated 210. This embodiment is similar in structure, function and operation to the other embodiments described herein with a few exceptions. For example, projectile shooting device 201 is in the form of a firearm, in particular, a rifle. The rifle includes a front aiming device 210A and a rear aiming device 210B. These front and rear aiming devices can be in the form of front and rear iron sights. The iron sights optionally can include sight elements 140 in the form of fiber optic elements that are visible to a user U, in the user's field of view FOV. The aiming devices 210A and 210B can be similar in structure, function and operation to the aiming devices of the embodiments described above with a few exceptions. Each of the aiming devices 210A and 210B can include a light source, a circuit and a sight element, for example, a fiber optic element. The front aiming device 210A, and in particular its sight element, can be illuminated with a light source that is powered by electricity generated from a thermoelectric module 220 mounted in the fore end of the stock 202C. This module 220 can be in electrical communication with the light source via an electrical coupling element 222. Optionally, the support structure 202, shown as a stock, and in particular, the fore end 202C can include one or more recesses within which the electrical connector element 222 is disposed. Indeed, a portion of the barrel of the firearm 202 can define a recess within which the electrical connector element 222 is disposed. The rear aiming device 210B can be separately powered from the front aiming device 210A, and can be distal from the front aiming device 210A. The rear aiming device 210B, and in particular, the light source 150 thereof can be in electrical communication with the thermoelectric modules 221 and 223 mounted in the pistol grip 202B and butt stock 202A of the stock 202. This is accomplished via electrical connector elements 222', which can be in the form of wires similar to the electrical connector element 222 in the front of the firearm. These thermoelectric modules can transmit electricity to the light source to illuminate the sight element 140, in a manner similar to the thermoelectric modules of the embodiments above. The thermoelectric modules 221 and 223 of this embodiment, however, can be arranged in parallel. In turn, the amperage generated by the thermoelectric modules is increased relative to a single module. When in this parallel configuration, each of the respective modules 221 and 222 can be associated with a voltage booster circuit (not shown) in a circuit of the aiming device 2108.

Optionally, although shown as including separate aiming devices 210A and 210B, with separate, isolated thermoelectric modules 220, 221 and 223, the firearm 201 can be outfitted to include a fiber optic element extending from the rear aiming device 2108 to the front aiming device 210A. This fiber optic element can extend along the barrel, optionally within a recess or otherwise under a cover, protected from the environment, up to the front sight of the firearm. The fiber optic element can be disposed in the front sight so that it is visible to a user U and within their field of view FOV when aiming or shooting the firearm. In this manner, the front fiber optic sight element can be illuminated by a light source 150 within or associated with the rear sight 2108. Accordingly, a front thermoelectric module 220 and associated wiring 222 can be absent from the construction. Of course, this construction can be reversed, so the front aiming device includes a light source that also illuminates the rear fiber optic sight element.

As will be appreciated, when utilizing fiber optics to transmit illumination from a light source in one location on a projectile shooting device to another location, those fiber optics can be protected in various ways. In some instances, they can be coated with a special coating to prevent them from cracking or breaking. The elements can be adhered to the exterior of the firearm. In other instances, components of the firearm, such as a stock, barrel, slide, receiver, rail or other component, can include a groove, recess or channel— or even an internal tube or cavity. The fiber optic element can be disposed through the same. These elements can be formed in the firearm when its components are initially constructed. For example, a slide or barrel can include a recess formed directly in the metal when the same is constructed. With a polymer stock, a recess or groove can be formed directly in the stock when it is molded from a polymer. Where a stock is constructed from wood, the groove or recess can be artfully produced in the wood.

Figure 13:
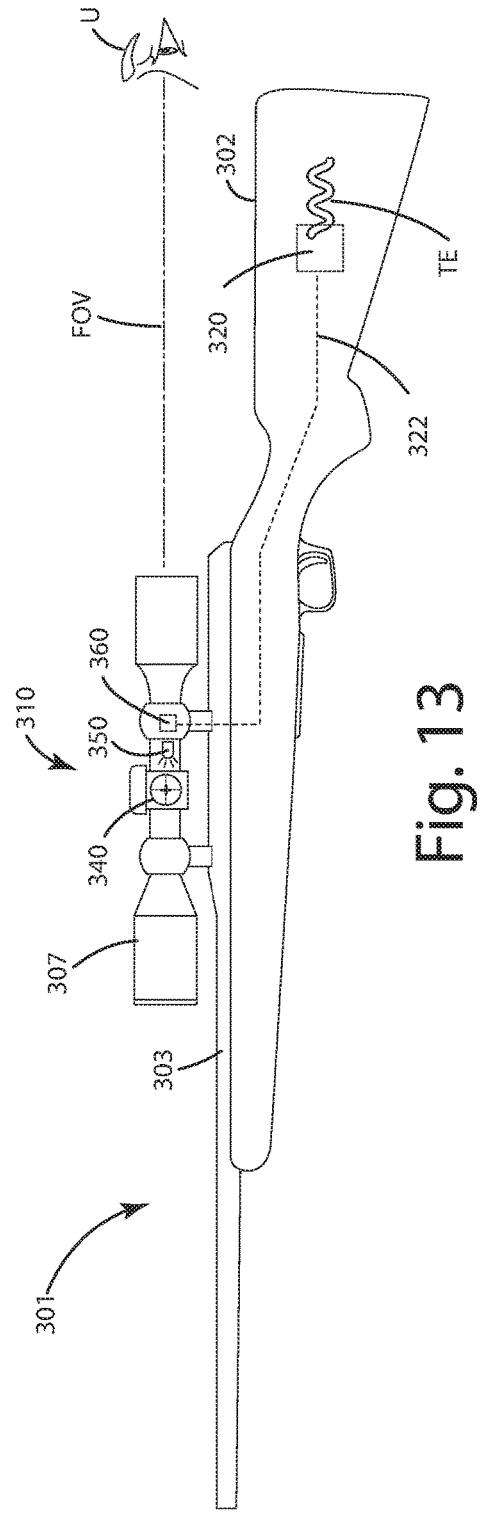
FIG. 13 is a side view of a projectile shooting device, namely a firearm, including a third alternative embodiment of the aiming device in the form of a rifle scope.
Figure 19:
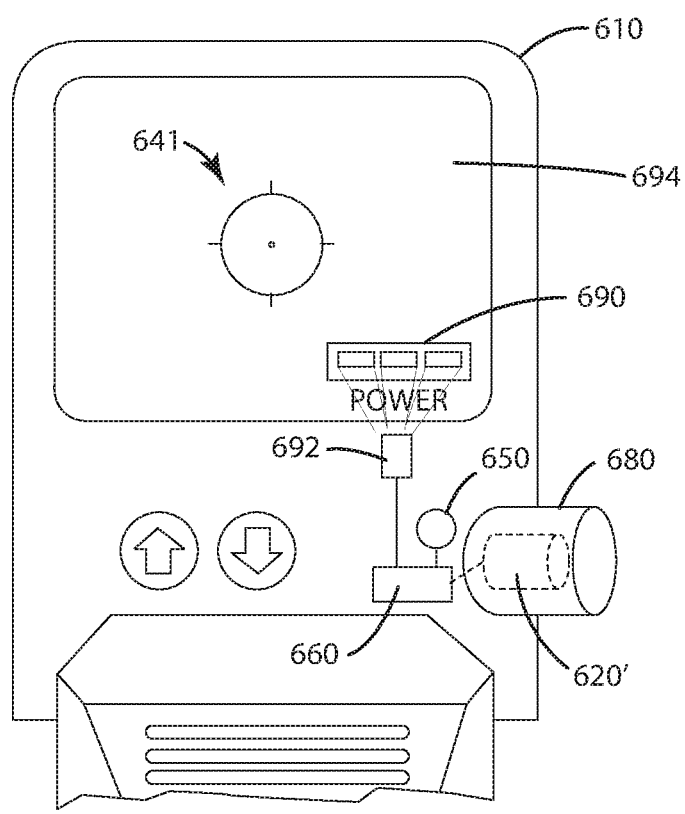
FIG. 19 is a schematic illustrating the sixth alternative embodiment of the aiming device of FIG. 18 from the perspective of a user when the firearm is in a shooting position.

A third alternative embodiment of an aiming device is illustrated in FIGS. 13 and 19 and generally designated 310. This embodiment is similar in structure, function and operation to the other embodiments described herein with a few exceptions. For example, the projectile shooting device in this construction also can be a firearm 301 in the form of a rifle. The rifle includes a barrel and a stock 302 attached thereto. The aiming device 310 is in the form of a scope including a sight element 340 in the form of a reticle, mounted in the within a rifle scope tube 307. The rifle scope tube can include conventional lenses, glass and other prism type magnifiers. It also can be constructed to be of a variable objective and can have one or more magnification settings if desired.

Generally, the aiming device 310 can be mounted to a support structure such as the barrel 303 or receiver. The aiming device can include a light source 350, which can be associated with a circuit 360. The circuit can be in electrical communication with a thermoelectric module 320 disposed in the stock 302 and/or other locations described in connection with the other embodiments herein. The thermoelectric module can be in electrical communication with the light source 350 via an electrical connector element 322 like those described in other embodiments herein. The module 320 can be placed in a location sufficient to absorb thermal energy TE from a user's body when the rifle is brought to a shooting position or into a field of view FOV of a user U.

Figure 14:
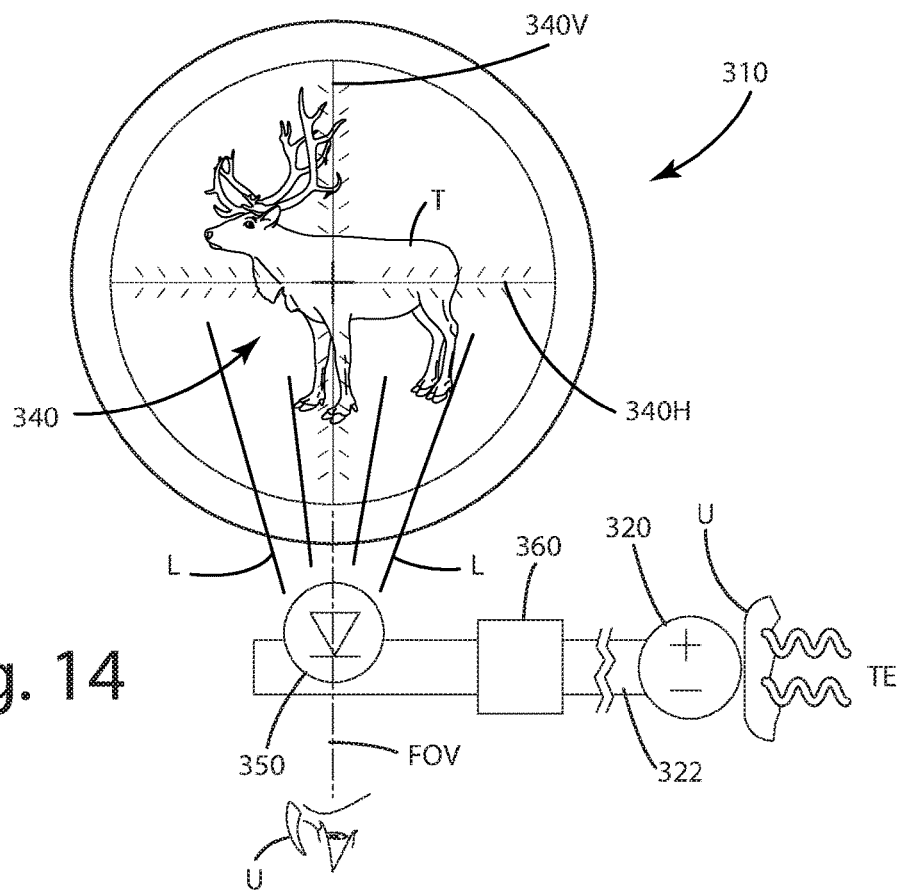
FIG. 14 is a schematic illustrating of the third alternative aiming device of FIG. 13 from a perspective of a user when the firearm is in a shooting position.

As shown in FIG. 14, the sight element 340 is in the form of a reticle having a vertical crosshair 340V and a horizontal crosshair 340H. The intersection of these crosshairs provides a point of aim. This point of aim can be aligned with a target so that the rifle 301 can be fired at the target, and assuming the aiming device is properly sighted in, the bullet will hit the target.

The reticle, and in particular the crosshairs are illuminated by the light source 350. The crosshairs 340V and 340H optionally can be coated with a special light absorbing or reflecting coating or material so that when the light from the light source 350 illuminates them, the crosshairs become illuminated or generally more visible, particularly in low ambient light conditions.

Optionally, as illustrated in FIG. 14, the light source 350 can be associated with a circuit 360 which can be in the form of any of the circuits described in any of the embodiments herein. This circuit and/or the light source 350 is in electrical communication with the thermoelectric module 320 which can absorb thermal energy TE from a user's body.

Figure 15:
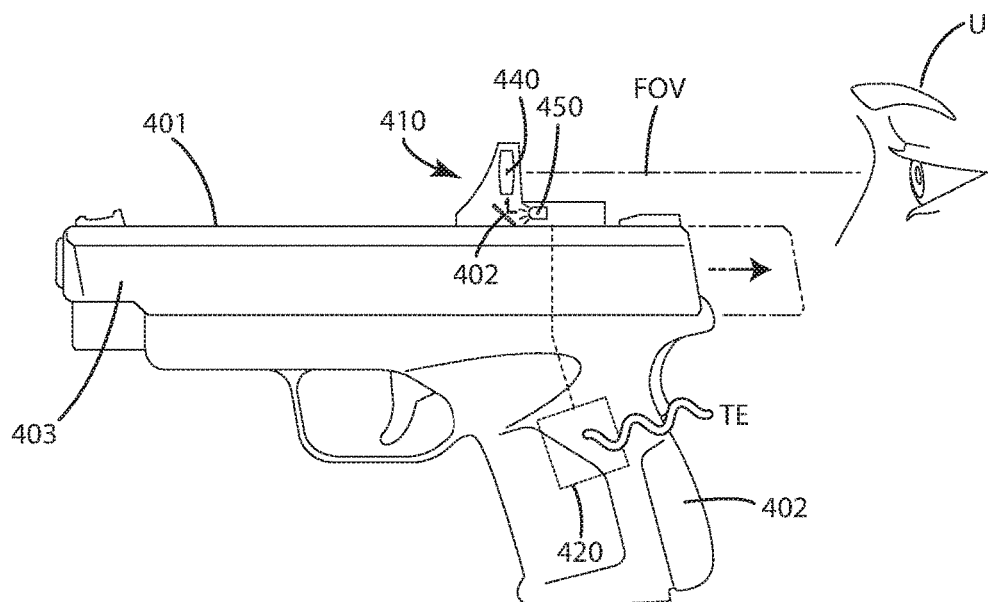
FIG. 15 is a side view of a projectile shooting device, namely a firearm, including a fourth alternative embodiment of the aiming device in the form of a red dot scope.
Figure 16:
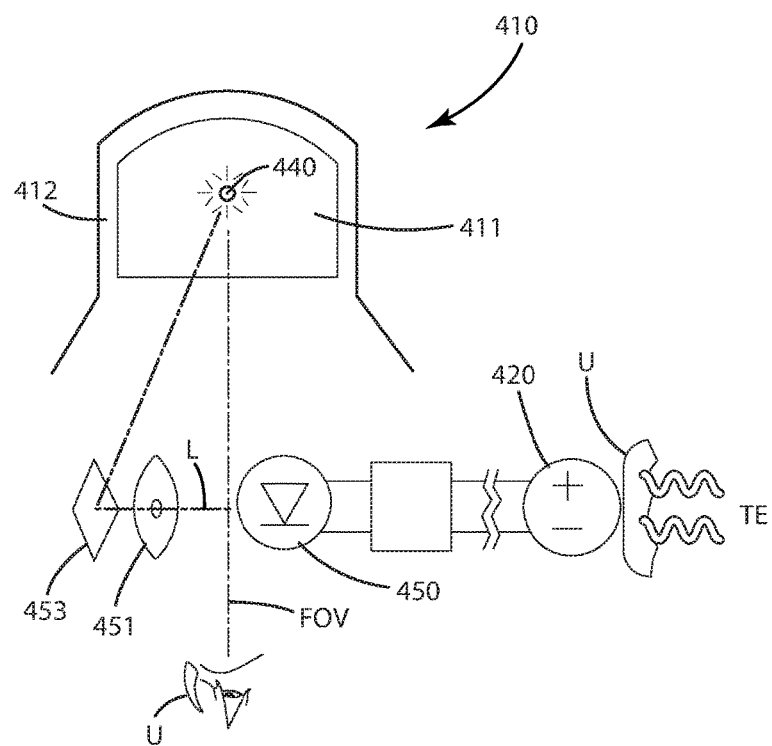
FIG. 16 is a schematic illustrating the fourth alternative embodiment of the aiming device of FIG. 15 from the perspective of a user when the firearm is in a shooting position.

A fourth alternative embodiment of the aiming device associated with a projectile shooting device, in the form of a semiautomatic pistol, is illustrated in FIGS. 15 and 16 and generally designated 410. This embodiment is similar in structure, function and operation to the other embodiments described herein with a few exceptions. For example, the device 401 is in the form of a pistol having a grip 402 and a slide 403. When the pistol is fired, the slide 403 slides rearward as shown in broken lines. Thus, the aiming device 410 mounted to the slide 403 also moves. The aiming device 410 can be in the form of a red dot scope which includes a red dot sight element 440. As used herein, the term red dot scopes also encompass reflex sights, which generally have the same structure and operate similar to red dot scopes. The sight element is a reflection of a light on a transparent or clear lens 411 disposed in a housing 412. In this embodiment, the sight element 440 can be considered the reflected light or dot that is displayed on the lens 411 or otherwise projected onto a viewing plane or surface. Generally, this sight element or red dot 440 is illuminated or created by the light source 450. More particularly, the light source projects illumination or light toward a plate 451. The plate includes one or more apertures 452. Only the light that goes through the aperture passes by plate 451. This light can be in the form of a small red, green or other colored dot depending on the color of the light source 450 projected on a viewing plane or surface. This dot is a reflected off of a mirror 453, and projected on the lens 411 within the field of view FOV of the user U as shown in FIG. 16. In the same manner as described above, the light source 450 can be powered directly or indirectly by the thermoelectric module 420, and in particular, by the thermal energy TE produced by the user U. Further optionally, the red dot can be substituted with any reticle typically used with projectile shooting devices such as firearms. In some cases, the substitute reticle can include multiple crosshairs to compensate for bullet drop. In other cases, the reticle can be a fast acquisition reticle; such as a circle or polygon, or a ballistic compensation reticle, a mil-dot reticle, and/or a ranging reticle. Any variety of reticle patterns is contemplated for use herein.

Optionally, the lens and certain other components of the red dot scope, also referred to as a reflex scope, can be modified from the optical sight disclosed in U.S. Pat. No. 8,443,541, entitled Optical Sight, which is hereby incorporated by reference in its entirety.

Although shown as a single dot sight element 440, the sight element of the aiming device 410 can be modified to be of virtually any appearance. For example, multiple dots can be aligned in a vertical line above one another on the lens 411. Alternatively, other types of dot or reticle configurations can be implemented directly on the lens 411. This can be accomplished by altering the shape and configuration of the aperture 452 of the plate 451 so that certain illumination patterns are generated by the light passing through specifically configured apertures.

Further optionally, the aiming device described herein can be used in systems that are not mounted to a projectile shooting device. For example certain types of red dot sight elements are used in conjunction with a finder's scope used in connection with photography (camera) or astronomy (telescope) conventional telescope. These types of red dot scopes are standalone units, and are not used as sighting devices for projectile shooting devices. Indeed, most of these scopes are either mounted directed to a camera, telescope and/or tripod. Again, these scopes can include all the elements and can function the same as the aiming device, for example, which is similar to a red dot scope used on a firearm, however, these devices simply are not mounted on a firearm or other projectile shooting device. Likewise, the other types of aiming devices described herein can also be utilized in conjunction with devices other than projectile shooting devices, such as cameras, telescopes or other long range viewing instruments.

Figure 17:
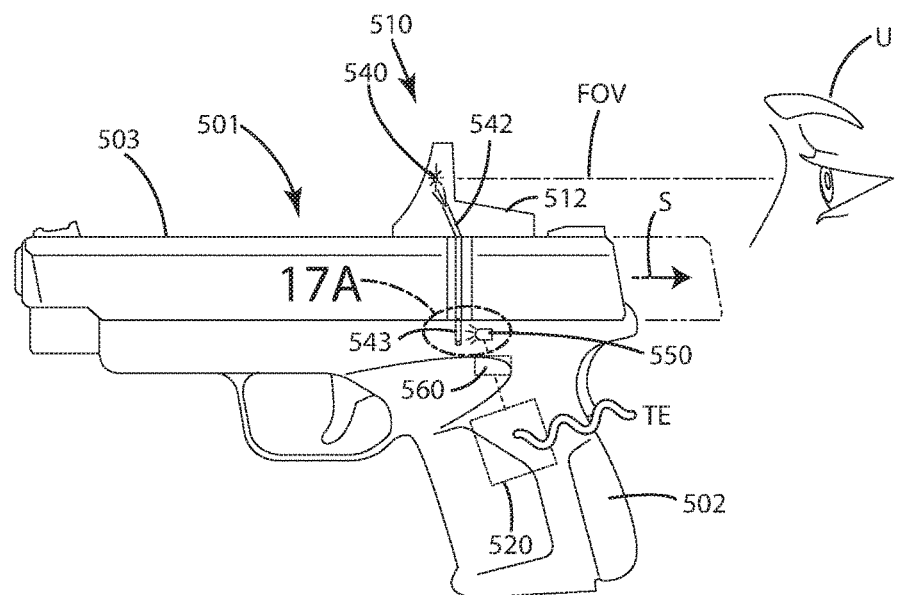
FIG. 17 is a side view of a projectile shooting device, namely a firearm, including a fifth alternative of the aiming device.
Figure 17A:
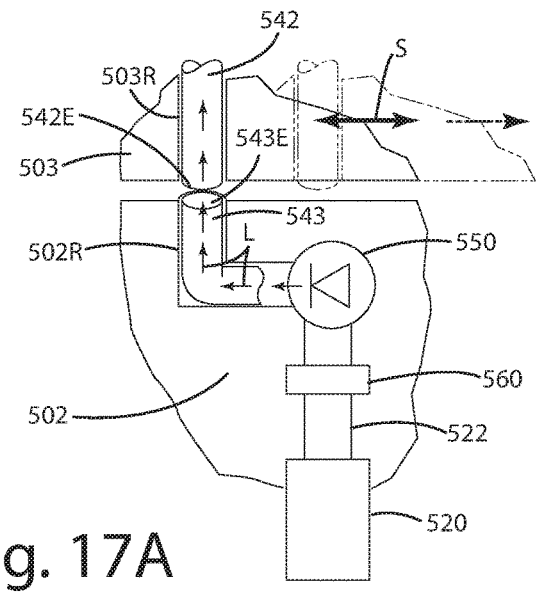
FIG. 17A is a close-up view of fiber optic elements taken from 17A of FIG. 17.

A fifth alternative embodiment of the aiming device associated with a projectile shooting device, in the form of a semiautomatic pistol, is illustrated in FIGS. 17 and 17A and generally designated 510. This embodiment is similar in structure, function and operation to the other embodiments described herein with a few exceptions. For example, this construction includes an aiming device 510 generally in the form of a red dot scope. The red dot scope, however, is operated via a fiber optic element that is generally disposed within the housing 512 of the aiming device 510. The sight element 540 itself is in the form of a dot or point that is reflected or otherwise projected onto a lens similar to that described above in connection with the lens 411 in the embodiment immediately above. This dot, however, is projected via the first fiber optic element 542 pointing at the lens. This fiber optic element 542 can be aimed toward the lens of the aiming device so that a small dot is within the field of view FOV of the user when illuminated.

The fiber optic 542 can extend out of the housing 512 and can be located within a recess 503R of the slide 503. The slide 503, as mentioned above, slides back and forth upon firing of a round. The sliding action feeds another round into a chamber, and thus the barrel of the firearm 501. The direction of movement is generally indicated by the arrows S depicted in FIGS. 17 and 17A. To account for this sliding movement and still transmit illumination with the fiber optic element 442, a chain of fiber optic elements that transmit illumination from one fiber optic element to another without direct contact is utilized.

As shown more particularly in FIG. 17A, the thermoelectric module 520, circuitry 560 and light source 550 can be disposed in the support structure 502, for example, the frame or hand grip of the firearm 501. The thermoelectric module operates off a thermal gradient generated by the user grasping the firearm to illuminate the light source 550. However, in this embodiment, a second fiber optic element 543, physically separated from the first fiber element 542 that extends up into the housing 512 of the aiming device 510, is mounted in proximity to the light source 550. In operation, light L from the light source 550 is projected on an end of the second fiber optic 543. The light as shown in arrows is transmitted through the second fiber optic element 543 to the end 543E of the second fiber optic element 543. When the end 542E of the first fiber optic element 542 is placed adjacent or generally aligned with the end 543E of the second fiber optic element 543, light transmitted out of the end 543E is transmitted directly to the end 542E of the fiber optic element 542. The light is conveyed through the element 542 and projected as sight element 540 within the aiming device.

Generally the ends 542E and 543E are aligned when the slide is stationary, that is, when a round is not being fired from the firearm as illustrated in FIG. 17A. However, when the round is fired, the slide 503 slides rearward in direction S. Upon sliding, the ends 542E and 543E are no longer aligned, thus even though the light source illuminates the secondary fiber optic element 543, that light is not transmitted to the fiber optic element 542 until the slide returns to its normal, stationary position. Upon return to that position, as shown in FIG. 17A, light is immediately transmitted from the secondary fiber optic 543 to the fiber optic 542 to provide a sight element 540 for the user U to view within their field of view FOV. During the sliding action, the sight element 540 may be temporarily interrupted or generally disappear from the user's field of view FOV because light is no longer being transmitted through the fiber optic element 542. Typically this is of little consequence because the firearm is slightly recoiling and the user cannot fully view the aiming device 510 anyway.

Of course, if desired, the second fiber optic element 543 can be duplicated so that the sight element 540 is always visible, as long as the light source 550 is on. For example, multiple additional second fiber optic elements (not shown) can be placed behind the fiber optic element 543 illustrated by the light source 550. During the rearward sliding of the slide in direction S at any one time, at least one of these additional second fiber optic elements can be aligned with the fiber optic element 542.

Optionally, given the debris, powder residue and other environmental features that the firearm 501 may encounter, the fiber optic elements 542 and 543 as illustrated can be disposed within recesses 503R and 502R, respectively. These recesses can further be covered, sealed or otherwise protected to protect the fiber optic elements therein. Further, although shown in conjunction with a semiautomatic pistol, the construction and multicomponent fiber optics used in this embodiment are well suited for semiautomatic rifles or other firearms including a slide or moving component upon which the aiming device is typically mounted.

Figure 18:
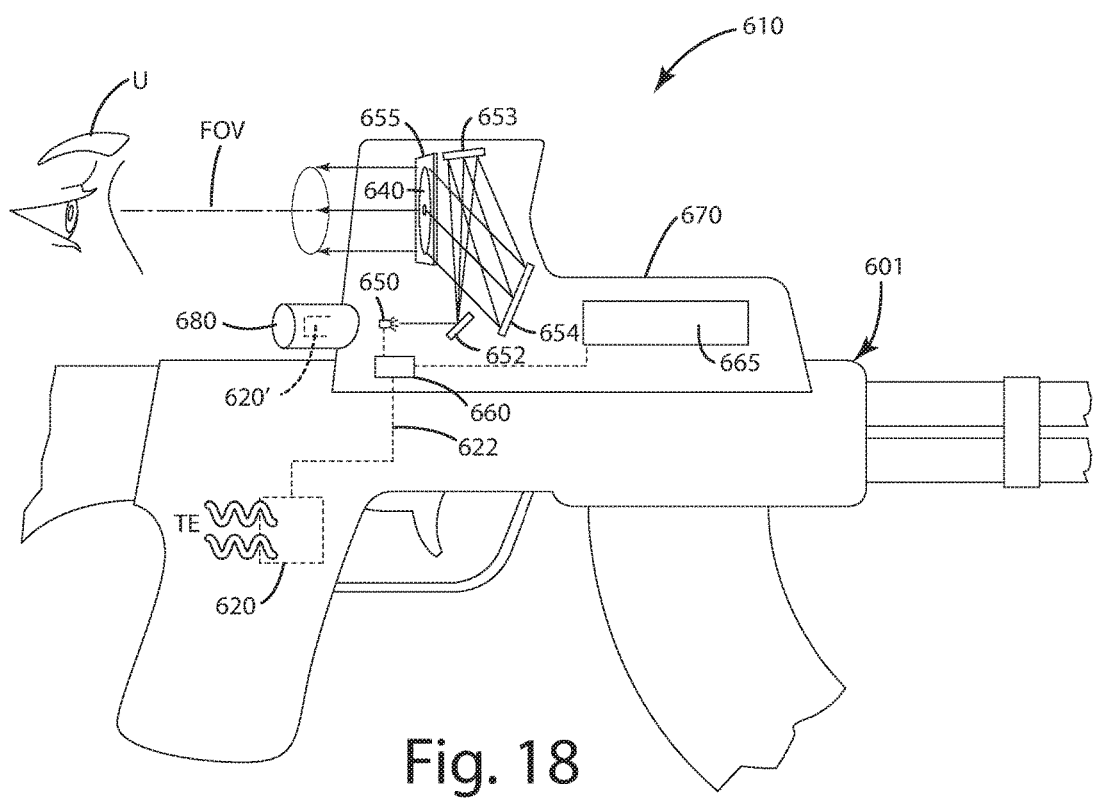
FIG. 18 is a side view of a projectile shooting device, namely a firearm, including a sixth alternative of the aiming device.

A sixth alternative embodiment of an aiming device associated with a projectile shooting device, in the form of a carbine, is illustrated in FIGS. 18 and 19 and generally designated 610. This embodiment is similar in structure, function and operation to the other embodiments described above herein with a few exceptions. For example, this construction includes an aiming device generally in the form of a holographic weapon sight, also referred to as a holographic diffraction sight or a holo sight. In this construction, the aiming device can include a light source 650 which can be associated with a circuit 660. This circuit can be in electrical communication with a thermoelectric module 620 disposed in the grip area and/or other locations described in connection with the other embodiments herein. The thermoelectric module 620 can be in electrical communication with light source 650 via an electrical connector element 622 like those described in the other embodiments herein. The module 620 can be placed in a location sufficient to absorb thermal energy TE from a user's body when the firearm is brought to a shooting positing or into a field of view of the user.

The light source 650 can be in the form of a laser diode, also commonly referred to as a laser. The sight element 640 in this case can be the reticle image hologram 640 recorded or disposed within the substrate 655 that is ultimately illuminated by the light from the light source 650 and subsequently creates the holographic image 641 which is superimposed on the field of view FOV. This reticle image hologram can be superimposed or displayed in the form of a desired image reticle or other aiming indicia, in the user's field of view FOV by way of a laser transmission hologram. Generally, the laser transmission hologram is a reticle image hologram 640 that is recorded in a substrate 655 or some other three dimensional space. The recorded hologram 640, or sight element, in the substrate 655 is illuminated via the light emitted by the light source/laser 650. In particular, the light source/laser diode 650 emits radiation onto a first reflector 652 which is transmitted to and reflected to a collimating reflector 653. The light thereafter reflects toward a holographic grating 654, and is then transmitted through the substrate 655, thereby illuminating the hologram/sight element 640 and creating the holographic image 641.

The aiming device 610 as illustrated can include a circuit 660 associated with the light source 650. Because the light source is a laser diode, it can require significant electricity to power it. If desired, a voltage booster as discussed in the embodiments herein, can be incorporated into the circuit. Additionally, a replaceable and/or rechargeable power source 665 such as a battery, can be included in the aiming device 610. This power source 665 and the other components of the aiming device can all be housed within a housing 670, which can withstand shock and vibration.

Optionally, the lens and certain other components of the holographic aiming device can be modified from the optical sight disclosed in U.S. Pat. No. 5,483,362 to Tai, which is hereby incorporated by reference in its entirety.

Further optionally, the light source 650 can be in communication with a circuit 660 which is further in communication with a grip area 680 in the form of a projection extending directly from the aiming device 610. Optionally, with this construction, the coupler 622 and the grip area 620 associated with the firearm 601 can be eliminated. In such a case, a user can grasp the projection 680. The projection 680 can include an internal thermoelectric module 620'. The thermoelectric module can generate electricity transferring it to the circuit 660 and the laser diode 650, thereby illuminating the laser diode.

Of course, the projection form of a grip area 680 shown in FIGS. 18 and 19 can be used in conjunction with any of the other rifle scopes, red dot scopes, fiber optic systems of the other aiming devices described in the embodiments herein. In these constructions, the thermal electric module is joined with or is associated directly with the aiming device (rather than being on the projectile shooting device, and can power the light source. Sometimes, the additional thermoelectric modules on different grip areas of the firearm, bow and or other projectile string device can be eliminated.

As shown in FIG. 19, the projection 680 can extend outwardly from at least a portion of the rear of the aiming device 610. This perspective also illustrates the projected hologram 641 within the field of view of the user. In addition, this view illustrates an optional feature for use in connection with the holographic weapon sight, which also can be used in conjunction with the red dot devices and any other electronic device used in conjunction with the thermoelectric module and concepts related thereto. Specifically, the viewing area 694 of the aiming device 610 can include a gauge 690 or other representation that is displayed within the user's field of view. This gauge can provide a visual indication of the relative power of a battery 665 and/or of electricity or current generated by the thermoelectric module 620' and generally being conveyed to or from the laser diode 650. This gauge 690 can be displayed by a small projector 692 onto the viewing area 694. Of course, in other implementations, a lower portion of the viewing area 694 can be in the form of a liquid crystal display or other visual output device that can display indicia representative of the amount of power stored by an optional battery in the aiming device, or the function of the thermoelectric module, or the input or output of electricity to the light source 650. Again, this type of power gauge and display of the same can be incorporated into any of the aiming device embodiments herein.

Further optionally, the aiming device 610 can be equipped with mechanical or electronic windage and/or elevation adjusters, so that the image hologram can be calibrated to provide accurate shooting adaptabilities. The other aiming devices of the other embodiments herein can optionally be equipped with such windage and elevation adjusters as well.

Figure 20:
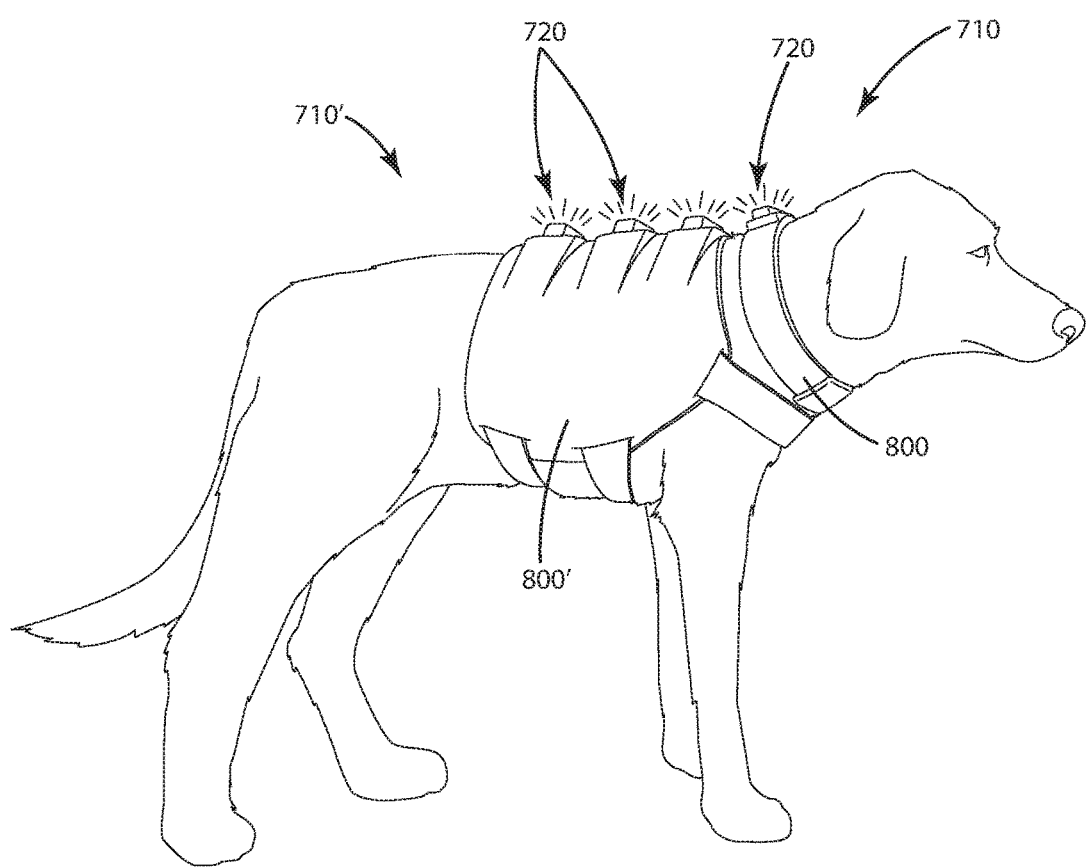
FIG. 20 is a perspective view of an illuminable device configured to be worn by a mammal having a thermoelectric module incorporated therein according to a seventh alternative embodiment.
Figure 21:
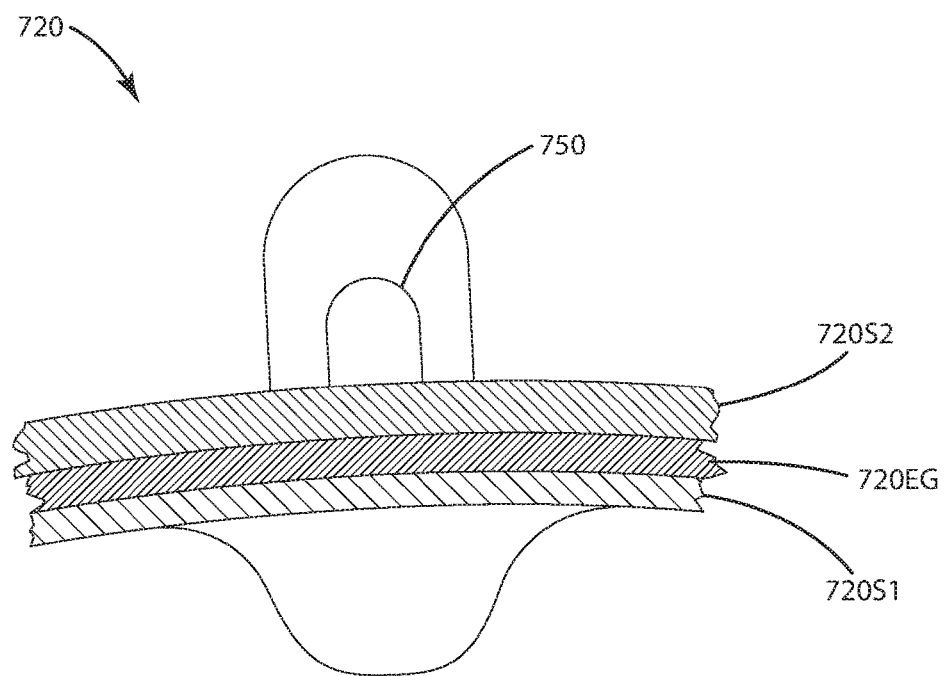
FIG. 21 is a schematic view of a thermoelectric module for use with the illuminable device of FIG. 20.
Figure 22:
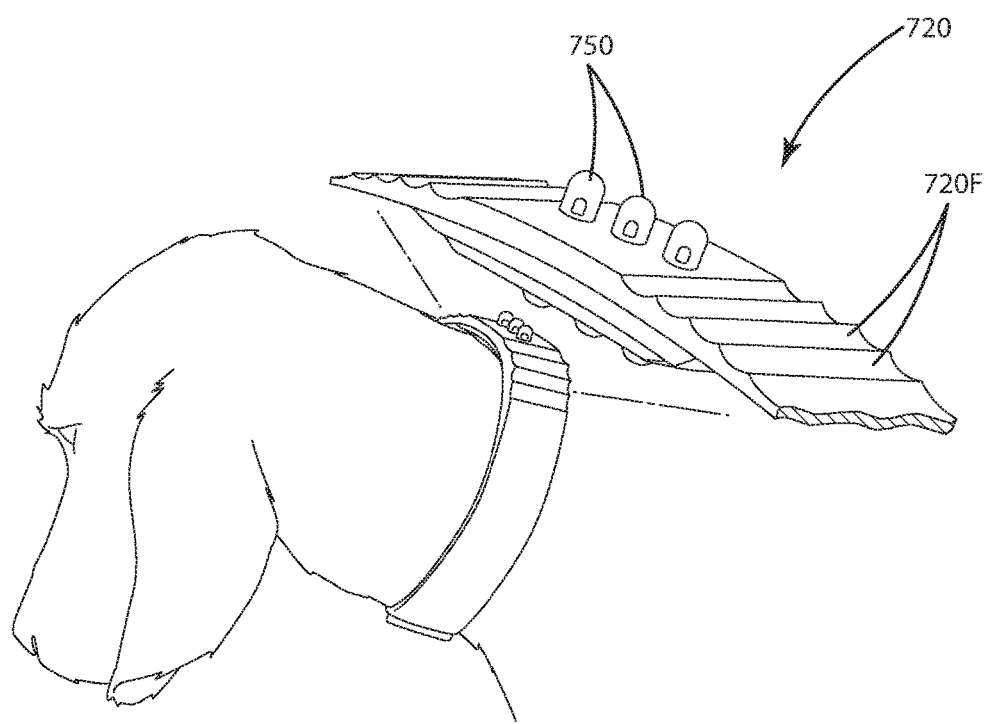
FIG. 22 is a schematic view of a thermoelectric module for use with the illuminable device of FIG. 20.

A seventh alternative embodiment is illustrated in FIGS. 20-22 and includes an illuminable device 710 into which a thermoelectric module 720 is incorporated. The thermoelectric module 720 is similar in structure, function, and operation to the other embodiments of the thermoelectric module described herein with a few exceptions. For example, the illuminable device 710 is configured to be worn by a mammal and the thermoelectric module 720 is electrically connected with a light source 750 for providing the mammal with visibility when the article is worn by the mammal and the light source 750 is illuminated.

Referring now to FIGS. 20 and 21, the illuminable device 710 includes a wearable article 800 configured to be worn by a mammal. In the embodiment of FIG. 20, the wearable article 800 is in the form of a collar adapted to be worn by a domesticated mammal, such as a dog (shown) or cat. The wearable article 800 may be in any suitable form to be worn by a mammal, examples of which include humans and domesticated animals. For example, FIG. 20 also illustrates an illuminable device 710' that is similar to the illuminable device 710, with some exceptions. The illuminable device 710' includes a wearable article 800' that is in the form of a vest (also referred to as a harness) that is worn about the body of the mammal. The illuminable device 710' can include multiple thermoelectric modules 720 to provide electricity to multiple light sources 750 incorporated into the wearable article 800'.

Additional non-limiting examples of the wearable article 800 include a shirt, a jacket, belt, head gear (for example, baseball caps, stocking caps, hard hats, helmets, goggles, eyewear, etc.) a bracelet, an arm band, a leg band, a socket, and an anklet. The wearable article 800 may be configured for a particular type of mammal, such as a dog or a human, and the dimensions of the wearable article 800 may be selected based on the intended wearer of the article 800. For example, a vest for a pet may include a loop for attaching a leash, whereas a vest for a human would typically not require such a loop. The wearable article 800 may be made of any suitable material, of any desired color, and may include any desired features, such as attachment straps, the details of which are not germane to the embodiments described herein.

Referring now to FIG. 21, the thermoelectric module 720 includes an electricity generator 720EG that generates electricity or voltage based on a thermal gradient existing across the thermoelectric module 720. Non-limiting examples of suitable electricity generators 720EG include thermoelectric generator (TEG), a Seebeck device, a thermoelectric cooler (TEC) and/or a Peltier module. The thermoelectric module 720 may generates electricity based on a thermal gradient generated by the transfer of thermal energy from the mammal's body in a manner similar to that described above with respect to the thermoelectric module 20 of FIGS. 2 and 2A.

The thermoelectric module 720 includes a first, interior surface 720S1 that is configured to come into contact with mammal's body when the mammal is wearing the wearable article 800 to receive thermal energy TE from the mammal. The thermoelectric module also includes a heat sink 720S2, also referred to as a cooler surface or heat exchanger. The thermal energy TE generated by the mammal generates a thermal differential across the thermoelectric module 720, between the interior surface 720S1 and the heat sink 720S2, that is converted to electrical power for use in illuminating the light source 750. The configuration of the heat sink 720S2 may be configured such that a sufficient thermal differential is generated to create sufficient electricity to power the light source 750. The configuration of the heat sink 720S2 may vary depending on the type of mammal the illuminable device 710 is intended for use with. Optionally, the configuration of the heat sink 720S2 varies depending on the type of wearable article 800 used. For example, a larger heat sink 720S2 may be required for an illuminable device 710 configured for use with a dog collar compared to an illuminable device 710 configured for use with a human arm band. The heat sink 720S2 can be made from any suitable material that transfers heat to the surrounding environment, non-limiting examples of which include metal and metal alloys, such as aluminum and aluminum alloys, copper, and composite materials.

Generally, the material from which the heat sink 720S2 is constructed selected to be of a colder temperature than the mammal's body in most ambient conditions. As an example, a human's body can be around 98° Fahrenheit. In winter weather, where the ambient temperature is about 0° Fahrenheit to 70° Fahrenheit, the heat sink 720S2 can be cooler than the human's body. Of course, in some cases, such as when the human is exercising and/or the weather is warm, the thermal gradient can be reversed. In this case, the thermal energy from the mammal, provided through the surface 720S1 to the module 720 can be less than the thermal energy or heat provided through the opposing surface 720S2. Optionally, the thermoelectric module can be constructed so that even with this reversed thermal gradient, it can generate electricity.

Referring now to FIG. 22, an exemplary heat sink 720S2 is illustrated for use with the dog collar 800 of FIG. 20. The heat sink 720S2 can include an elongated body and a plurality of raised features 720F in the form of cooling fins for facilitating the dissipation of heat generated by the mammal's body and transferred across the thermoelectric module 720. The dimensions of the heat sink 720S2, the shape of the fins 720F, the number of fins 720S, and/or the dimensions of the fins 720F may be selected to provide the desired level of heat dissipation based on the intended use.

The light source 750 may be any suitable light source for illuminating the wearable article 800 worn by the mammal. Non-limiting examples of light sources include light emitting diode (LED), an organic light emitting diode (OLED), and a laser diode. A single thermoelectric module 720 may be electrically connected to a single light source 750 to provide power to the light source. Optionally, multiple light sources 750 may be electrically connected to a single thermoelectric module 720 to receive electricity for powering the light source 750. The configuration of the thermoelectric module(s) 720 and the light source(s) 750 may be selected based on the desired intensity of the generated light. In one example, one or more light sources 750 are connected with a fiber optic to distribute light emitted by the light source(s) 750 across at least a portion of the wearable article 800.

Optionally, thermoelectric module 720 and light source 750 is electrically connected to a circuit that includes a voltage booster in a manner similar that described above for the thermoelectric module 720 and light source 750 in circuit 60'. The voltage booster may be used to increase the voltage output from the thermoelectric module 720 to provide the desired electrical output for powering the light source(s) 750. Optionally, a replaceable and/or rechargeable power source, such as a battery (not shown), can be included in illuminable device 710 similar to the battery 665 of the aiming device 610 of FIG. 19.

Optionally, the thermal energy can be used to generate electricity with the thermoelectric module, which subsequently can be used to charge/recharge a power source and/or directly or indirectly power the device. Where the power source is provided in a circuit to provide electricity or voltage to the device and/or its components, the thermoelectric module can be considered to indirectly power the device because, technically, the generated electricity is flowing from the power source. Where no power source is included in the circuit, the thermoelectric module can be considered to directly power the device, with the generated electricity flowing from that thermoelectric module to the device requiring electricity to power some feature or function. In either case, the generated electricity that came directly or indirectly from the thermoelectric module can be eventually transferred to the device, and/or its components, such as the light source, the light receiving unit, the calculating unit and/or the display. It is also to be noted that generated electricity produced by the thermoelectric module is still considered generated electricity herein, whether or not that generated electricity has been boosted by voltage booster circuit, and whether or not that generated electricity has been stored in and/or discharged from a power source.

Optionally, the thermoelectric module 720 and light source 750 is electrically connected to a circuit that includes an on/off switch in a manner similar to that described above for the circuit 60 of FIGS. 8 and 8A. The on/off switch can be utilized in conjunction with capacitors and/or a battery. Voltage and/or electricity generated by the thermoelectric module 720 can be stored in the capacitor or a battery. The mammal can effectively "charge" the capacitor while wearing the wearable article 800 before use, such as during a walk that begins before dark. As the evening progresses and the ambient light decreases, the electricity stored in the capacitor and/or battery can be utilized by switching the switch to the "on" position. This in turn supplies power to the components of the illuminable device 710 electrically connected with the circuit. Optionally, an additional switching circuit that can stop the flow of electricity or voltage through the circuit thereby turning the components off until needed, can be provided if the capacitor cannot store sufficient power.

Figure 23:
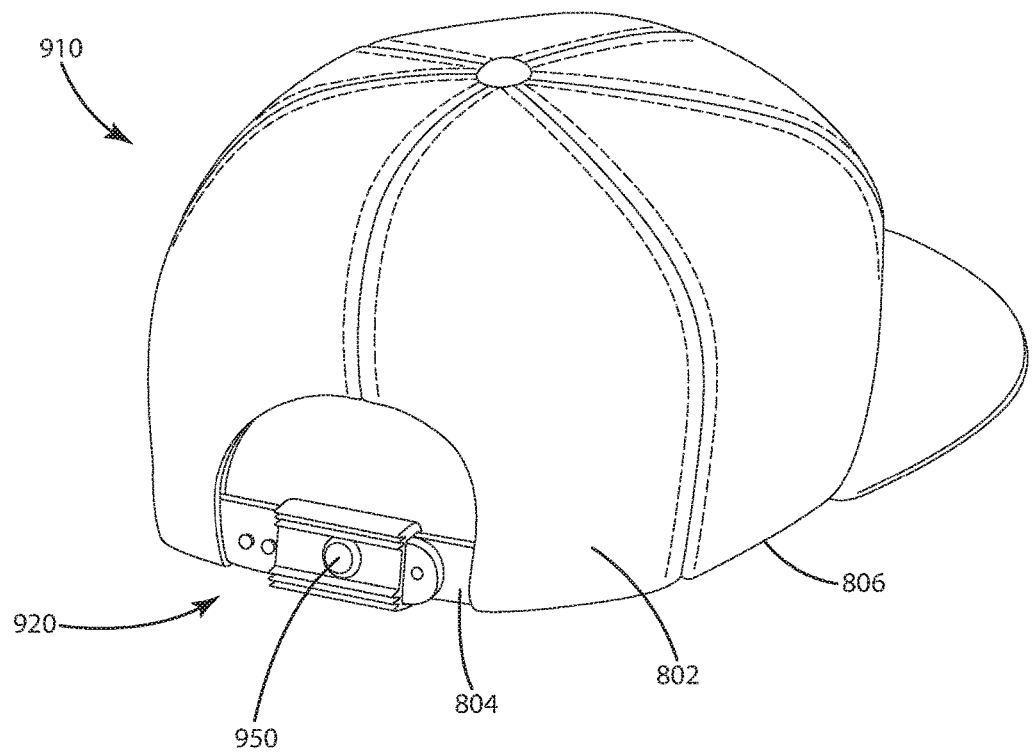
FIG. 23 is a perspective view of an illuminable device configured to be worn by a mammal having a thermoelectric module incorporated therein according to an eighth alternative embodiment.
Figure 24:
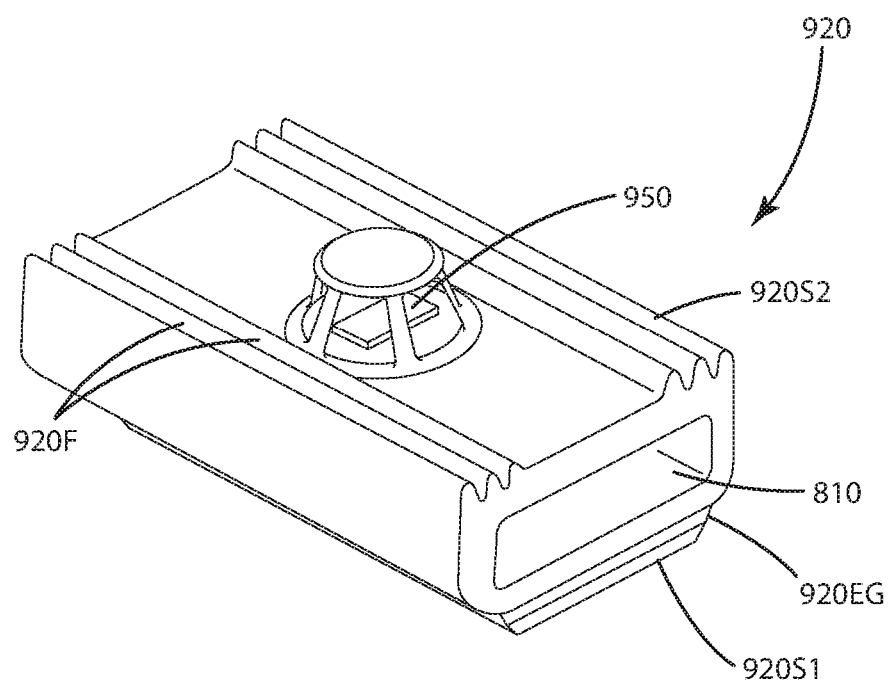
FIG. 24 is a perspective view of a thermoelectric module for use with the illuminable device of FIG. 23.

An eighth alternative embodiment is illustrated in FIGS. 23-24 and includes an illuminable device 910 into which a thermoelectric module 920 is incorporated. The thermoelectric module 920 is similar in structure, function, and operation to the thermoelectric module 720 of FIGS. 20-22. In this embodiment, the illuminable device 910 is in the form of a ball cap 802 configured to be worn on the head of a human.

The illuminable device 910 may be mounted to the ball cap 802 such that the interior surface 920S1 is in thermal contact with the mammal's body in order to generate the thermal differential for powering the light source 950. The illuminable device 910 may be mounted on any part of the ball cap 802 such that the interior surface 920S1 is in thermal contact with the mammal's body, non-limiting examples of which include an adjusting strap 804 or a lower edge 806. As illustrated in FIG. 24, the illuminable device 910 can include a channel 810 configured to receive the adjusting strap 804 to mount the illuminable device 910 on the ball cap 802. In this manner, the illuminable device 910 can be mounted onto any ball cap having an adjustable strap simply by sliding the illuminable device 910 onto the strap. Optionally, the illuminable device 910 may be mounted to the ball cap 802 using any suitable mechanical or non-mechanical fastener, non-limiting examples of which include clips, hook-and-loop tape, snaps, ties, clamps, and adhesives.

While the illuminable device 910 is illustrated for use with a ball cap 802, the illuminable device 910 may be used with any other type of wearable article to which the illuminable device 910 may be mounted such that the interior surface 920S1 is in thermal contact with mammal's body. For example, the illuminable device 910 may be mounted to a human sock, shoe, head band, arm band, bracelet, anklet, or shirt or jacket collar. The illuminable device 910 may also be mounted to wearable articles worn by a domesticated animal, such as a pet collar or a vest. The illuminable device 910 is not limited to any particular type of wearable article as long as the illuminable device 910 can be mounted such that the interior surface 920S1 is in thermal contact with mammal's body for generating the thermal gradient used to generate power for the light source 950.

Directional terms, such as "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation(s).

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular. Any reference to claim elements as "at least one of X, Y and Z" is meant to include any one of X, Y or Z individually, and any combination of X, Y and Z, for example, X, Y, Z; X, Y; X, Z; and Y, Z.

The embodiments of the invention in which an exclusive property or privilege is claimed are defined as follows:

1. An illuminable device configured to be mounted on an article worn by a mammal, the illuminable device comprising:
    a mounting element comprising a rigid body that defines an elongate, closed channel configured to slide onto the article worn by the mammal;
    a thermoelectric module joined with the rigid body and having a surface disposed outside the elongate, closed channel; and
    a light source joined with the rigid body and in electrical communication with the thermoelectric module, the thermoelectric module adapted to power the light source so that the light source emits illumination;
    wherein the thermoelectric module is configured such that when the rigid body is slid onto the article worn by the mammal, the surface of the thermoelectric module is disposed adjacent the mammal's body and thermal energy from the mammal's body is transferred to the thermoelectric module,
    wherein the thermoelectric module is configured to generate electricity sufficient to power the light source as a result of thermal energy transformed from the mammal's body.

2. The illuminable device of claim 1 comprising a plurality of light sources and a plurality of thermoelectric modules, each light source in electrical communication with at least one thermoelectric module.

3. The illuminable device of claim 1 comprising a power source, the power source in electrical communication with the thermoelectric module, the thermoelectric module providing electricity to the power source, the power source adapted to store energy and transfer the energy to the light source.

4. The illuminable device of claim 3 comprising a switch to selectively transfer energy to the light source.

5. The illuminable device of claim 1 wherein the thermoelectric module is at least one of a thermoelectric generator, a Seebeck device, a thermoelectric cooler, and a Peltier module.

6. The illuminable device of claim 1 wherein the light source is connected to a fiber optic for transmitting light emitted by the light source over at least a portion of the article.

7. The illuminable device of claim 1 wherein:
the rigid body includes an interior side disposed adjacent the mammal's body when the article is worn by the mammal and an exterior side, opposite the interior side; and
a heat sink disposed on the exterior side of the rigid body.

8. The illuminable device of claim 7 wherein the heat sink comprises a plurality of raised features.

9. The illuminable device of claim 1 wherein the light source is selected from the group consisting of a light emitting diode (LED), an organic light emitting diode (OLED), and a laser diode.

10. The illuminable device of claim 9 wherein the thermoelectric module is at least one of a thermoelectric generator, a Seebeck device, a thermoelectric cooler, and a Peltier module.

11. A method of illuminating an article configured to be worn by a mammal, the method comprising:
providing a mounting element comprising a rigid body that defines an elongate, closed channel configured to be slid onto an article worn by the mammal, the mounting element supporting a thermoelectric module having a surface disposed outside the elongate, closed channel, wherein the thermoelectric module is configured such that when the rigid body is slid onto the article worn by the mammal, the surface of the thermoelectric module is disposed adjacent a body of the mammal, the surface of the thermoelectric module disposed in a location sufficient to transfer thermal energy from the mammal's body to the thermoelectric module, thereby creating a thermal gradient as a result of the transfer of the thermal energy from the mammal's body;
generating electricity with the thermoelectric module due to the thermal gradient;
powering a light source joined with the mounting element with the electricity; and
illuminating the article with the light source,
wherein the thermoelectric module is configured to generate electricity sufficient to power the light source as a result of thermal energy transferred from the mammal's body such that the illuminated article provides a visible alert of the presence of the mammal.

12. The method of claim 11 comprising:
providing at least one of a capacitor and a battery joined with the mounting element;
establishing electrical communication between the thermoelectric module and the at least one of a capacitor and a battery; and
charging the at least one of a capacitor and a battery with the electricity generated by the thermoelectric module.

13. The method of claim 12 wherein the at least one of a capacitor and a battery stores the electricity and transfers the electricity to the light source during said powering step.

14. The method of claim 13 comprising:
actuating a switch to selectively supply the stored electricity to the light source.

15. The method of claim 11 comprising:
providing a voltage booster;
establishing electrical communication between the thermoelectric module and the voltage booster; and
increasing a voltage of the electricity generated by the thermoelectric module and supplied to the light source.

16. The method of claim 11 wherein the mammal is a human,
wherein the article is a hat donned on the human's head,
wherein the human's head produces the thermal gradient that powers the light source with the electricity,
wherein the mounting element is mounted on the hat.

17. The method of claim 16 wherein the hat includes an adjusting strap, and the elongate, closed channel is configured to receive the adjusting strap to mount the rigid body on the hat.

18. The method of claim 11 wherein the article includes a strap, and the elongate, closed channel is configured to receive the strap to mount the rigid body on the article.

19. The illuminable device of claim 7 wherein the light source is disposed on the exterior side of the rigid body, opposite and distal from the thermoelectric module.

* * * * *